United States Patent
Hayashi et al.

(10) Patent No.: US 7,513,716 B2
(45) Date of Patent: Apr. 7, 2009

(54) WORKPIECE CONVEYOR AND METHOD OF CONVEYING WORKPIECE

(75) Inventors: Takayuki Hayashi, Shimosuwa (JP); Seiichiro Yamashita, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/715,775

(22) Filed: Mar. 8, 2007

(65) Prior Publication Data

US 2007/0212174 A1    Sep. 13, 2007

(30) Foreign Application Priority Data

| Mar. 9, 2006 | (JP) | .............................. 2006-064354 |
| Mar. 9, 2006 | (JP) | .............................. 2006-064355 |
| Mar. 9, 2006 | (JP) | .............................. 2006-064356 |
| Mar. 9, 2006 | (JP) | .............................. 2006-064359 |

(51) Int. Cl.
*B65G 51/00* (2006.01)

(52) U.S. Cl. .............................. 406/88; 406/87; 406/95

(58) Field of Classification Search ................... 406/87, 406/88, 93, 95; 198/626.1, 626.3; 414/676
See application file for complete search history.

(56) References Cited

U.S. PATENT DOCUMENTS

| 2,805,898 | A | * | 9/1957 | Willis, Jr. ...................... 406/88 |
| 3,395,943 | A | * | 8/1968 | Wilde et al. ................... 406/88 |
| 3,734,567 | A | * | 5/1973 | Fong ........................... 406/86 |
| 3,773,391 | A | * | 11/1973 | Crandall et al. ............... 406/88 |
| 4,131,320 | A | * | 12/1978 | Volat et al. .................... 406/88 |
| 4,469,218 | A | * | 9/1984 | Cosse ........................ 198/438 |
| 4,618,292 | A |   | 10/1986 | Judge et al. |
| 4,676,699 | A | * | 6/1987 | Leonov ...................... 406/86 |
| 4,773,522 | A | * | 9/1988 | Lenhart ................... 198/418.7 |
| 5,299,890 | A | * | 4/1994 | Spatafora et al. ............. 406/88 |
| 5,951,006 | A | * | 9/1999 | Biegelsen et al. ........... 271/195 |
| 5,984,591 | A | * | 11/1999 | Hilbish et al. ................ 406/88 |
| 6,040,553 | A | * | 3/2000 | Ross ..................... 219/121.71 |
| 6,241,427 | B1 | * | 6/2001 | Hessburg et al. ............. 406/88 |
| 6,402,436 | B1 | * | 6/2002 | Murphy ....................... 406/86 |
| 6,584,991 | B1 | * | 7/2003 | Ries ......................... 134/131 |
| 6,612,785 | B1 | * | 9/2003 | Ouellette ..................... 406/88 |
| 6,808,358 | B1 | * | 10/2004 | Mayerberg et al. .......... 414/676 |
| 6,853,874 | B2 | * | 2/2005 | Kawada et al. .............. 700/213 |
| 7,004,711 | B2 | * | 2/2006 | Ikehata et al. ............... 414/676 |
| 7,108,474 | B2 | * | 9/2006 | Moriya et al. ............... 414/676 |

FOREIGN PATENT DOCUMENTS

| JP | 10-087042 | 4/1998 |
| JP | 10-157851 | 6/1998 |
| JP | 2003-063636 | 3/2003 |

* cited by examiner

*Primary Examiner*—Douglas A Hess
(74) *Attorney, Agent, or Firm*—Harness, DIckey & Pierce, P.L.C.

(57) ABSTRACT

There is provided a workpiece conveyor including a workpiece conveying path which guides the conveyance of a workpiece; and a pair of air-blowing devices which are disposed on both sides of the workpiece conveying path and blow air uniformly to the workpiece on the workpiece conveying path from both sides to give propulsion to the workpiece for conveyance.

20 Claims, 14 Drawing Sheets

WORKPIECE CONVEYOR AND METHOD OF CONVEYING WORKPIECE

The entire disclosure of Japanese Patent Application Nos. 2006-064355, 2006-064356, 2006-064354, and 2006-064359 filed Mar. 9, 2006 is expressly incorporated by reference herein.

BACKGROUND

1. Technical Field

The present invention relates to a workpiece conveyor which conveys a workpiece by a belt conveyor, air, or the like and a method of conveying a workpiece.

2. Related Art

A known workpiece conveyor is of a type which blows out air upwardly from a workpiece conveying path, on which a workpiece is conveyed, to float the workpiece while blowing out air from both sides of the workpiece conveying path more powerfully than from the central area thereof to guide the workpiece to the central area. In this state, the workpiece conveyor blows out air from spouts provided in the workpiece conveying path in the conveying direction to give propulsion to the workpiece for conveyance. Reference is made to JP-A-10-157851 as an example of related art. According to this workpiece conveyor, a workpiece can be conveyed without deviating from the workpiece conveying path.

There is another known type of workpiece conveyor in which a plurality of groups of poles provided on both sides of a roller conveyor to make a pair are moved to the central area from both sides of a workpiece conveyed by the roller conveyor, thereby positioning the workpiece at the central area of the roller conveyor. Reference is made to JP-A-2003-063636 as an example of related art. Accordingly, even if a workpiece is mounted on the roller conveyor while deviating from the workpiece conveying path, it can be positioned at the central area by the poles. As a result, the workpiece can be prealigned while being conveyed.

There is still another known type of workpiece conveyor which conveys a workpiece mounted on a pair of belt conveyors while making the workpiece applied with auxiliary guides provided along the outsides of the pair of belt conveyors. Reference is made to JP-A-10-087042 as an example of related art. Accordingly, it is possible to properly convey various workpieces approximately identical in size.

With the configuration of JP-A-10-157851, however, there arises a first problem that it is necessary to blow out air from both sides of the workpiece conveying path more powerfully than from the central area thereof to convey a workpiece without deviating from the workpiece conveying path. It is also necessary to consider air turbulence resulting from a possible air collision. Unfortunately, it is complicated to control air due to matters involving the blowing amount of air, the blowing direction thereof, the number and the arrangement of spouts, which cause an increased air consumption.

Meanwhile, when a plurality of workpieces are conveyed by the workpiece conveyor, they are conveyed on the workpiece conveying path with a gap provided therebetween. If a preceding workpiece is caused to be in a standby state on the workpiece conveying path in this case, it is necessary for the following workpiece to maintain a safe distance from the preceding one and avoid getting contact with it. Incidentally, as a second problem, if the gap between the plurality of workpieces is to be maintained by physical contact, the workpieces could be damaged. For example, when a glass substrate, etc. is used as a workpiece, there is a possibility of causing chipping or invisible cracking at contact points. It is of particular note that, this kind of cracks tend to be overlooked at the inspection stage, and the trouble is that cracks are liable to be found after workpieces have been manufactured.

With the configuration of JP-A-2003-063636, furthermore, there arises a third problem that a workpiece is damaged due to physical contact because the plurality of groups of poles are made contact with the conveyed workpiece to make the same positioned at the central area of the roller conveyor. For example, when a glass substrate, etc. is used as a workpiece, there is a possibility of causing chipping or invisible cracking at contact points. It is of particular note that, this kind of cracks tend to be overlooked at the inspection stage, and the trouble is that cracks are liable to be found after workpieces have been manufactured.

With the configuration of JP-A-10-087042, furthermore, there arises a fourth problem, in addition to those described above, that a workpiece smaller in size than that mountable on the pair of belt conveyors cannot be conveyed because the pair of belt conveyors are fixedly provided. It is not possible, therefore, to perform conveyance according the size of a workpiece.

SUMMARY

It is an advantage of the invention to provide a workpiece conveyor which can convey a workpiece properly and efficiently by air with a simple configuration and a relatively small amount of air. It is another advantage of the invention to provide a workpiece conveyor which can convey a plurality of workpieces by air so as not to make them contact each other without applying a braking force and a repressing force. It is still another advantage of the invention to provide a workpiece conveyor and a method of conveying a workpiece which can convey a workpiece while positioning and prealigning the same at the central area of a belt without contacting the workpiece. It is yet another advantage of the invention to provide a workpiece conveyor which can convey a workpiece properly in accordance with the size thereof.

According to a first aspect of the invention, there is provided a workpiece conveyor. The workpiece conveyor comprises: a workpiece conveying path which guides the conveyance of a workpiece; and a pair of air-blowing devices which are disposed on both sides of the workpiece conveying path and blow air uniformly to the workpiece on the workpiece conveying path from both sides to give propulsion to the workpiece for conveyance.

According to this configuration, air is blown to the workpiece to give propulsion to both sides thereof uniformly. Therefore, the workpiece can be conveyed while being brought to the central area of the workpiece conveying path. As a result, the workpiece can be conveyed with its posture controlled without deviating from the workpiece conveying path.

In this case, preferably, the respective air-blowing devices include a plurality of propulsion nozzles which blow air to the side surface of the workpiece from a direction oblique to the conveying direction and are arranged side by side in the conveying direction.

According to this configuration, air can be blown to the workpiece such that a vector in the conveying direction serves as propulsion for the workpiece and a vector in a direction orthogonal to the conveying direction serves to move the workpiece to the central area of the workpiece conveying path. Furthermore, the plurality of propulsion nozzles can convey the workpiece efficiently with a small amount of air as compared with slit-like propulsion nozzles.

In this case, preferably, an interval between the plurality of propulsion nozzles of the respective air-blowing devices is shorter than one-half the length of the side surface of the workpiece.

According to this configuration, air can be blown to the side surface of the workpiece from at least two group of propulsion nozzles. Therefore, the workpiece can be properly brought to the central area of the workpiece conveying path with its posture controlled and be given propulsion in the conveying direction.

In this case, preferably, the respective air-blowing devices further include a plurality of propulsion nozzles which blow air to the side surface of the workpiece from a direction oblique to the conveying direction and a plurality of control nozzles which blow air to the side surface of the workpiece from a direction orthogonal to the conveying direction to control the posture of the workpiece, and the plurality of propulsion nozzles and control nozzles are arranged side by side in the conveying direction in a mixed state.

According to this configuration, the workpiece can be positioned by the control nozzles at the central area of the workpiece conveying path with its posture directed substantially parallel to the conveying direction and can be conveyed by the propulsion nozzles in this state.

In this case, preferably, the pair of air-blowing devices have the respective propulsion nozzles and control nozzles arranged opposite to each other.

According to this configuration, air is blown to the workpiece from the propulsion nozzles all the time. Therefore, the conveyance speed of the workpiece can be made stable.

In this case, preferably, an interval between the plurality of propulsion nozzles and the plurality of control nozzles of the respective air-blowing devices is shorter than one-half the length of the side surface of the workpiece.

According to this configuration, air can be blown to the side surface of the workpiece from the control nozzles. Therefore, the workpiece can be positioned at the central area of the workpiece conveying path with its posture corrected even if it deviates from the workpiece conveying path relative to the conveying direction. Furthermore, air can be blown to the side surface of the workpiece from the propulsion nozzles. Therefore, the workpiece can be given propulsion in the conveying direction while being properly brought to the central area of the workpiece conveying path.

In this case, preferably, a width of the workpiece conveying path is formed narrower than that of the workpiece.

According to this configuration, the workpiece conveyor can be made small in size. In this case, the width of the workpiece conveying path is preferably formed wider than one-half the width of the workpiece to prevent the workpiece from falling.

In this case, preferably, the workpiece conveying path is composed of a pair of divided conveying paths on which a workpiece is straddlingly mounted and includes a separation distance adjusting device which moves at least one of the pair of divided conveying paths to a direction orthogonal to the conveying direction for adjusting a separation distance between the pair of divided conveying paths.

According to this configuration, a separation distance between the pair of divided conveying paths can be properly adjusted in accordance with the size of the workpiece conveyed. Therefore, the workpiece having a desired size can be conveyed without being restricted by the size thereof.

In this case, preferably, the pair of divided conveying paths extend parallel to each other in the conveying direction, and the separation distance adjusting device adjusts the separation distance between the pair of divided conveying paths while keeping their parallel state.

According to this configuration, a workpiece having a desired size can be conveyed by corresponding a separation distance between the pair of divided conveying paths to the size of the workpiece.

In this case, preferably, the pair of divided conveying paths extend non-parallel to each other and taperingly in a truncated chevron shape in the conveying direction, and the separation distance adjusting device adjusts the separation distance between the pair of divided conveying paths while keeping their non-parallel state.

According to this configuration, the workpiece mounted on the pair of divided conveying paths can be conveyed while being brought to the central area of the pair of divided conveying paths as it is conveyed forward in the conveying direction. In other words, since the pair of divided conveying paths are formed in a truncated chevron shape, air is blown to the workpiece more powerfully as it is conveyed. As a result, the workpiece is automatically positioned at the central area of the pair of divided conveying paths as it is conveyed.

According to a second aspect of the invention, there is provided a workpiece conveyor. The workpiece conveyor comprises: a workpiece conveying mechanism which makes a plurality of workpieces guided into a workpiece conveying path and conveys by air the same having a gap provided therebetween in a conveying direction; and a plurality of intermediate air-dropping devices which are disposed above the workpiece conveying mechanism and blow air from above into the respective gaps between the plurality of conveyed workpieces to maintain the respective gaps.

According to this configuration, the respective gaps between the workpieces can be maintained by the air from the intermediate air-dropping devices. Therefore, the workpieces are free from contact with each other even if any one or plural workpieces are in a standby state. Furthermore, since the respective gaps are maintained by air, the workpieces could not be damaged due to physical contact. Note that air may be blown to the workpieces when the workpieces are is under conveyance, at rest, or even at all times.

In this case, preferably, the plurality of intermediate air-dropping devices blow air uniformly to make the plurality of gaps uniform.

According to this configuration, the respective gaps between the plurality of workpieces can be made uniform. Therefore, a conveyance interval between the workpieces can be made constant, which also makes it possible to position the workpieces easily.

In this case, preferably, the workpiece conveyor further comprises: a baffle plate which is disposed ahead of a conveyance ending position of the workpiece conveying path and extends in a direction orthogonal to the conveying direction; and an end air-dropping device which blows air from above into the gap between the baffle plate and the workpiece having reached the conveyance ending position to position the workpiece at the conveyance ending position.

Similarly, it is preferable that the workpiece conveyor further comprise: an end air-dropping device which is disposed ahead of a conveyance ending position of the workpiece conveying path and blows air obliquely backward from above to the workpiece having reached the conveyance ending position to position the workpiece at the conveyance ending position.

According to this configuration, the workpiece can be positioned at the conveyance ending position. Therefore, an operation such as picking up a workpiece can be easily performed at the conveyance ending position.

In this case, preferably, the plurality of intermediate air-dropping devices and the end air-dropping device respectively have a slit-like air nozzle extending in a direction orthogonal to the conveying direction.

According to this configuration, air can be uniformly blown to the front surface of the conveyed workpiece. Therefore, it is possible to maintain the respective gaps between the plurality of workpieces and position the plurality of workpieces properly.

In this case, preferably, the plurality of intermediate air-dropping devices and the end air-dropping device respectively have a plurality of air nozzles provided in line in a direction orthogonal to the conveying direction.

According to this configuration, air can be uniformly blown to the front surface of the conveyed workpiece. Therefore, it is possible to maintain the respective gaps between the plurality of workpieces and position the plurality of workpieces properly. Furthermore, the plurality of propulsion nozzles can convey the workpiece with a small amount of air as compared with the slit-like air nozzle described above.

In this case, preferably, the respective intermediate air-dropping devices blow air in a direction oblique to the conveying direction.

According to this configuration, air can be relatively blown to the workpiece from above by matching the conveyance speed of the workpiece to the air blowing angle especially when the workpiece is conveyed. Therefore, the gap between the workpieces can be properly maintained during the conveyance.

In this case, preferably, the workpiece conveying mechanism further includes the pair of air-blowing devices described above.

According to this configuration, air is blown to both side surfaces of the workpiece for uniform propulsion. Therefore, the workpiece can be conveyed while being brought to the central area of the workpiece conveying path. As a result, the workpiece can be conveyed with its posture controlled without deviating from the workpiece conveying path.

In this cases, preferably, the workpiece conveying path is composed of a plurality of actuating air plates successive in a conveying direction and formed of a perforated plate and an air chamber communicating with the perforated plate, and further includes an air supplying device which supplies air to the air chamber to float the workpiece through the perforated plate.

According to this configuration, the workpiece can be floated. Therefore, the frictional force generated between the workpiece and the workpiece conveying path can be remarkably reduced, thereby making it easier to control the posture of the workpiece and convey the workpiece by air.

In this case, preferably, the workpiece conveyor further comprises: a vacuum suction device which sucks air from the air chamber to suck the workpiece through the perforated plate; and a switch controlling device which switches between the air supplying device and the vacuum suction device.

According to this configuration, the workpiece can be vacuum-sucked and fixed on the workpiece conveying path. Therefore, the workpiece can be sucked and fixed in a pre-aligned state, for example, when it is picked up at the conveyance ending position. As a result, the workpiece can be picked up without deviating from the workpiece conveying path.

In this case, preferably, the perforated plate is a porous plate.

According to this configuration, a relatively small amount of air can be uniformly blown from the whole surface of the porous plate.

According to a third aspect of the invention, there is provided a workpiece conveyor. The workpiece conveyor comprises: a belt conveyor in which a workpiece is mounted on a belt and conveyed; and a pair of air-blowing devices which are disposed on both sides of the belt conveyor and blow air to the workpiece conveyed by the belt from both sides. The pair of air-blowing devices blow air uniformly to both side surfaces of the workpiece to control the posture thereof in the plane surface of the belt.

Furthermore, according to the invention, there is provided a method of conveying a workpiece comprising blowing air uniformly to both side surfaces of a workpiece conveyed by a belt conveyor from both sides to convey the workpiece while controlling its posture in the plane surface.

According to this configuration, air is uniformly blown to both side surfaces of the workpiece. Therefore, the workpiece is positioned at the central area of the belt and conveyed with its posture substantially parallel to the conveying direction. Since the workpiece is free from contact with any object, it can be conveyed while being prealigned in a direction orthogonal to the conveying direction without being given any damage. As a result, it is not necessary to install a dedicated apparatus for prealignment of the workpiece at the conveyance ending position (transferring position). Note that air may be blown to the workpiece W when the workpiece is under conveyance (movement), at rest, or even at all times. Furthermore, an air blowing nozzle may be of a slit-like long type or be formed of a plurality of arrayed nozzles.

In this case, preferably, the pair of air-blowing devices include a plurality of groups of blowing nozzles which are arranged at the same position orthogonal to the conveying direction to make a pair.

According to this configuration, air can be properly blown to both side surfaces of the workpiece. Therefore, air can be efficiently blown to the workpiece without being consumed wastefully.

In this case, preferably, the respective blowing nozzles blow air in a direction substantially orthogonal to the conveying direction.

According to this configuration, air can be blown to the central area of the belt. Therefore, the workpiece can be efficiently positioned at the central area of the belt by air.

In this case, preferably, an interval between the plurality of blowing nozzles of the respective air-blowing devices is shorter than one-half the length of the side surface of the workpiece.

According to this configuration, air can be blown to the side surface of the workpiece by at least two groups of blowing nozzles. Therefore, the workpiece can be positioned at the central area of the belt with its posture corrected even if it deviates from the belt in the conveying direction.

In this case, preferably, the plurality of blowing nozzles of the respective air-blowing devices are disposed at uniform intervals from a position near a conveyance starting position to a conveyance ending position of the belt conveyor.

According to this configuration, the workpiece can be accurately prealigned at the conveyance ending position even if it has mounted on the belt deviating from the conveyance starting position.

In this case, preferably, the plurality of blowing nozzles of the respective air-blowing devices are disposed from a position near a conveyance starting position to a conveyance ending position of the belt conveyor in such a manner that the blowing nozzles are densely disposed as they get closer to the conveyance ending position.

According to this configuration, the workpiece can be accurately prealigned at the central area of the belt as it approaches the conveyance ending position.

In this case, preferably, the workpiece conveyor further comprises: an air controlling device which individually controls an amount of air blown from the plurality of blowing nozzles. The air controlling device controls an amount of air blown from the respective air nozzles such that the workpiece receives an increasing amount of air as it approaches the conveyance ending position.

According to this configuration, the workpiece can be accurately prealigned at the central area of the belt as it approaches the conveyance ending position.

In this case, preferably, a width of the belt is formed narrower than that of the workpiece.

According to this configuration, the workpiece conveyor can be made small in size. In this case, the width of the belt is preferably wider than one-half the width of the workpiece to prevent the workpiece from falling.

According to a fourth aspect of the invention, there is provided a workpiece conveyor. The workpiece conveyor comprises: a pair of belt conveyors in which a workpiece is mounted straddlingly on belts arranged parallel to each other and is conveyed; and a separation distance adjusting device which moves at least one of the pair of belt conveyors to a direction orthogonal to the conveying direction for adjusting a separation distance between the pair of belt conveyors.

According to this configuration, a separation distance between the pair of belt conveyors can be properly adjusted in accordance with the size of the workpiece conveyed. Therefore, the workpiece having a desired size can be conveyed without being restricted by the size thereof.

In this case, preferably, the pair of belt conveyors extend parallel to each other in the conveying direction, and the separation distance adjusting device adjusts the separation distance between the pair of belt conveyors while keeping their parallel state.

According to this configuration, a workpiece having a desired size can be conveyed by corresponding a separation distance between the pair of divided conveying paths to the size of the workpiece.

In this case, preferably, the pair of belt conveyors extend non-parallel to each other and taperingly in a truncated chevron shape in the conveying direction, and the separation distance adjusting device adjusts the separation distance between the pair of divided conveying paths while keeping their non-parallel state.

According to this configuration, the workpiece mounted on the pair of belt conveyors can be conveyed while being brought to the central area of the pair of divided conveying paths as it is conveyed forward in the conveying direction. In other words, since the pair of belt conveyors are formed in a truncated chevron shape, the mounting areas of the workpiece on both belts increase as the workpiece is conveyed. Therefore, when the workpiece is mounted on the pair of belt conveyors while leaning to the one side thereof, the frictional resistance at the mounting portion on the side where the workpiece leans to is caused to increase. The workpiece is thereby prompted to be mounted on the mounting portion on the other side (lateral movement of the workpiece). Accordingly, the workpiece is automatically positioned at the central area of the pair of belt conveyors as it is conveyed.

In this case, preferably, the separation distance adjusting device further comprises: a plurality of guide rails which extend in the direction orthogonal to the conveying direction and slidably support the pair of belt conveyors; and a widening/narrowing moving mechanism which is capable of pulling in and pulling away the pair of belt conveyors simultaneously with one end locked to one belt conveyor and the other end locked to the other one.

According to this configuration, the pair of belt conveyors can be smoothly moved (a separation distance between the pair of belt conveyors is adjusted) with a simple configuration. Furthermore, the pair of belt conveyors can be pulled in and pulled away relative to the central area of the center position.

In this case, preferably, the widening/narrowing moving mechanism includes a front widening/narrowing moving mechanism which is disposed at the front part of the widening/narrowing moving mechanism in the conveying direction and a rear widening/narrowing moving mechanism which is disposed at the rear part thereof in the conveying direction, and the front widening/narrowing moving mechanism and the rear widening/narrowing moving mechanism are configured to be capable of individually adjusting movement.

According to this configuration, the pair of belt conveyors can be properly moved in such a manner as to create their parallel state or their non-parallel state having a truncated chevron shape.

In this case, preferably, the front widening/narrowing moving mechanism and the rear widening/narrowing moving mechanism are composed of a double thread screw mechanism in which a left-hand screw and a right-hand screw are formed.

According to this configuration, a separation distance between the pair of belt conveyors can be accurately adjusted with a simple configuration. Note that the double thread screw mechanism may be manually operated or be automatically operated.

In this case, preferably, the workpiece conveyor further comprises the pair of air-blowing devices described above.

According to this configuration, air is uniformly blown to both side surfaces of the workpiece. Therefore, the workpiece is positioned at the central area of the pair of belt conveyors and conveyed with its posture substantially parallel to the conveying direction. As a result, the workpiece can be conveyed while being prealigned in a direction orthogonal to the conveying direction.

In these cases, preferably, the belt includes an actuating air plate formed of a perforated plate and an air chamber communicating with the perforated plate at least at a position on which the workpiece is mounted, and further comprises an air supplying device which supplies air to the air chamber to float the workpiece through the perforated plate.

According to this configuration, the workpiece can be floated. Therefore, the frictional force generated between the workpiece and the belt can be remarkably reduced, thereby making it easier to control the posture of the workpiece by air. Note that supplying air from the air supplying device on the fixed side to the actuating air plate on the movable side is preferably performed through a rotary joint or the like.

In this case, preferably, the workpiece conveyor further comprises: a vacuum suction device which sucks air from the air chamber to suck the workpiece through the perforated plate; and a switch controlling device which switches between the air supplying device and the vacuum suction device.

According to this configuration, the workpiece can be vacuum-sucked and fixed on the respective belts. Therefore, the workpiece can be sucked and fixed in a prealigned state, for example, when it is picked up at the conveyance ending position. As a result, the workpiece can be picked up without deviating from the workpiece conveying path. In this case also, sucking air from the actuating air plate on the movable side to the vacuum suction device on the fixed side is preferably performed through a rotary joint or the like.

In this case, preferably, the perforated plate is a porous plate.

According to this configuration, a relatively small amount of air can be uniformly blown from the whole surface of the porous plate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a description will be made about a workpiece conveyor according to the present embodiment with reference to the accompanying drawings. Meanwhile, in order to mount components such as a flexible substrate (FOG) and a driver chip (COG) on a glass substrate or the like, the respective components and the glass substrate are prealigned (with a precision of plus or minus 0.1 mm) as a preliminary step. In the next step, the images of alignment marks formed on the respective components and the glass substrate are recognized by the use of an image recognition device, a precision stage, or the like. Based on the image recognition result, a high-precision alignment (with a precision of plus or minus 0.002 mm) is performed with the precision stage. After this step, the respective components are united to the glass substrate and mounted thereon. Note that the prealignment performed as the preliminary step refers to an operation for imaging the alignment marks in the image recognition device. The workpiece conveyor used herein performs prealignment of a workpiece such as a glass substrate used with a liquid crystal panel mounted on a workpiece conveying path while conveying the workpiece by air along the workpiece conveying path.

Figure 1A:
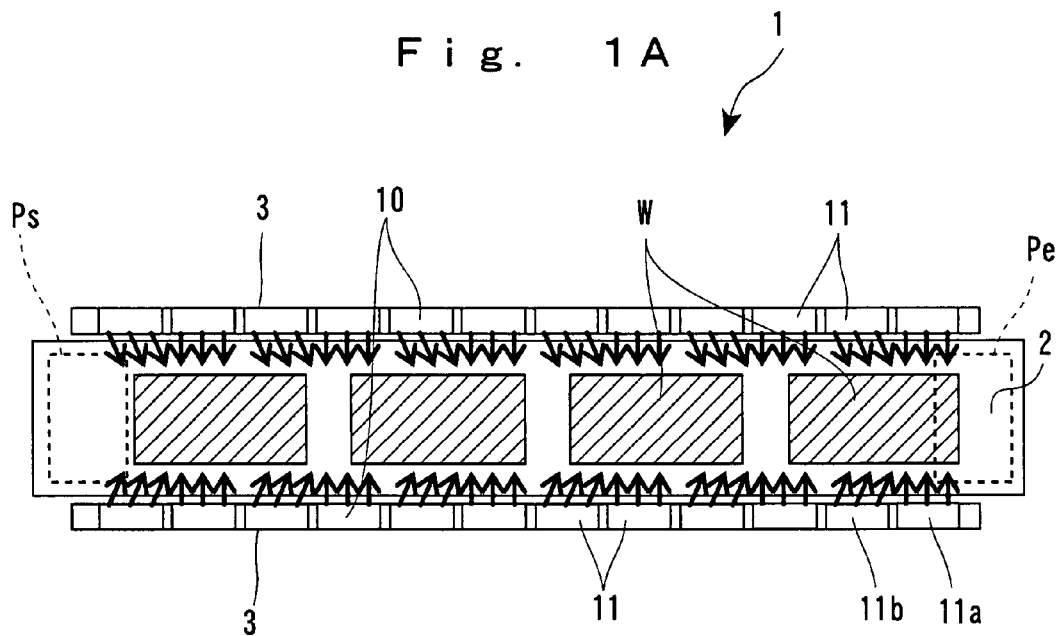
FIGS. 1A to 1C are explanatory drawings of a workpiece conveyor according to a first embodiment.
Figure 1B:
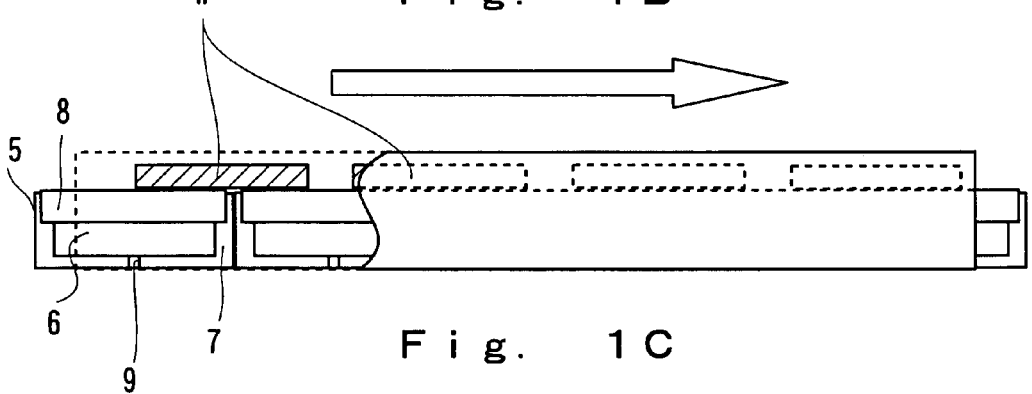
Figure 1C:
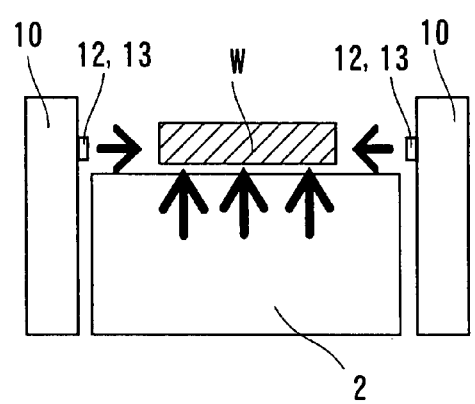

As shown in FIGS. 1A to 1C, a workpiece conveyor 1 includes a workpiece conveying path 2 and a pair of air-blowing units 3 standingly provided along both sides of the workpiece conveying path 2. The pair of air-blowing units 3 extend slightly shorter in length than the workpiece conveying path 2 from a conveyance starting position Ps to a conveyance ending position Pe of the workpiece conveying path 2 and blow air to a workpiece W conveyed by the workpiece conveying path 2.

The workpiece conveying path 2 is formed of a plurality of successive actuating air plates 5. The respective actuating air plates 5 include a rectangular frame 7 serving as a base and a porous plate 8 fitted into the upper portion of the frame 7. Provided under the porous plate 8 is an air chamber 6. The respective air chambers 6 have an air connecting port 9 opened on the lower side thereof. Through a switching valve (not shown), the air connecting port 9 is switchably connected to a compressed air supplying unit and an air suction unit of the plant. When air is supplied from the compressed air supplying unit, it is uniformly blown upwardly from the whole surface of the porous plate 8 to float the workpiece W. When the switching valve is switched to be connected to the air suction unit, on the other hand, the workpiece W is vacuum-sucked on the porous plate 8. Thus, when the workpiece W is removed (transferred) at the conveyance ending position Pe or stopped by causing a processing unit disposed at a midway point of the workpiece conveying path 2 to access the workpiece W to stop the conveyance during the conveyance of a plurality of workpieces W from the conveyance starting position Ps to the conveyance ending position Pe, the workpiece is sucked and fixed by vacuum suction. In resuming the conveyance, air is blown to float the workpieces W. Note that the amount of air to be blown may be such as to float the workpiece W slightly.

The pair of air-blowing units 3 include: a pair of rectangular air boxes 10 which are disposed along both sides of the workpiece conveying path 2 and extend from the conveyance starting position Ps to the conveyance ending position Pe; a plurality of control nozzles 12 which are provided to communicate with the respective air boxes 10 and opposite to each other sandwiching the workpiece conveying path 2, and which blow air in a direction orthogonal to the conveying direction; and a plurality of propulsion nozzles 13 which blow air in an inclined direction between the conveying direction and the direction orthogonal thereto.

The respective air boxes 10 are divided in the longitudinal direction to form plural pieces of divided air boxes 11. The respective divided boxes 11 thus formed are provided with three (a plurality of) control nozzles 12 or three (a plurality of) propulsion nozzles 13. In other words, the plurality of divided boxes 11 are composed of two kinds of divided boxes, namely, control divided boxes 11a having the control nozzles 12 and propulsion divided boxes 11b having the propulsion nozzles 13. The respective control divided boxes 11a and propulsion divided boxes 11b are disposed opposite to each other sandwiching the workpiece conveying path 2. The plurality of divided boxes 11 are respectively connected with the compressed air supplying unit (not shown) of the plant through a flow regulating valve or the like. The air supplied from the compressed air supplying unit is regulated to be blown such that it is uniformly blown to both side surfaces of the workpiece W from the respective control nozzles 12 and propulsion nozzles 13 through the respective divided boxes 11. Note that the flow regulating valve or the like is preferably provided in each of the control nozzles 12 and the propulsion nozzles 13.

The plurality of control nozzles 12 and propulsion nozzles 13 of the respective air boxes 10 are provided in line at the upper portion of the respective air boxes 10 from the conveyance starting position Ps to the conveyance ending position Pe such that they are arranged at uniform intervals. The air blowing angle is so adjusted that the control nozzles 12 may intersect perpendicularly to the conveying direction of the workpiece conveying path 2, and that the propulsion nozzles 13 may be directed in an inclined manner between the conveying direction and the direction orthogonal thereto. The interval between the plurality of control nozzles 12 and that between the plurality of propulsion nozzles 13 are set to the length shorter than one-half the length of the side surface of the workpiece W, whereby air is blown to the workpiece W from at least two groups of the nozzles 12 and 13. Note that the three control nozzles 12 and three propulsion nozzles 13 of the respective divided boxes 11 may be integrally formed in a slit-like shape.

When the workpiece W is mounted on the workpiece conveying path 2 at the conveyance starting position Ps, air is upwardly blown to the bottom surface of the workpiece W from the porous plate 8 to float the workpiece W. Simultaneously, air is blown to both side surfaces of the workpiece W from the plurality of groups of propulsion nozzles 13 and control nozzles 12 facing both sides of the workpiece W. Thereby, the plurality of groups of propulsion nozzles 13 convey the workpiece W while moving the same to the central area of the workpiece conveying path 2, whereas the plurality of groups of control nozzles 12 control the posture of the workpiece W to follow its course in the conveying direction. In other words, the air from the propulsion nozzle 13 is blown to the workpiece W such that a vector in the conveying direction serves as propulsion for the workpiece W and a vector in a direction orthogonal to the conveying direction serves to move the workpiece W to the central area of the workpiece conveying path 2. The workpiece W is conveyed while being gradually prealigned and finally reaches the conveyance ending position Pe in a prealigned state. Thereafter, the workpiece W is transferred to the next-stage apparatus by a pick-up device or the like which picks up an object by vacuum suction.

Figure 2:
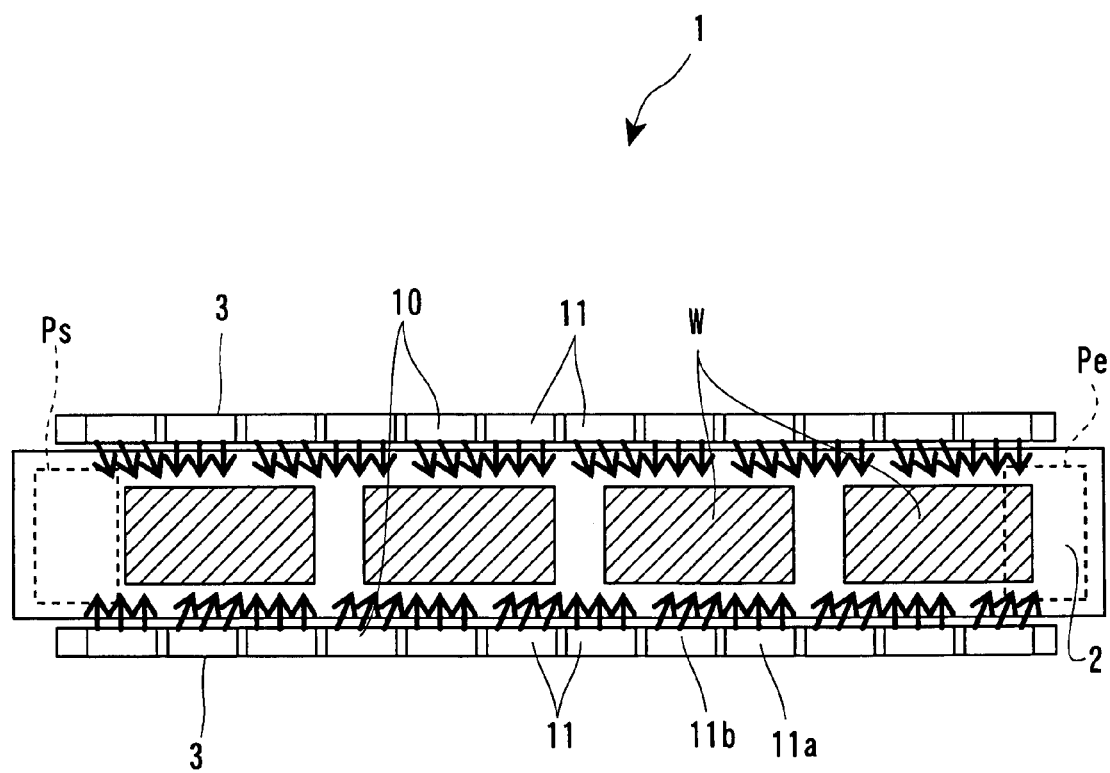
FIG. 2 is an explanatory drawing of the workpiece conveyor in which propulsion nozzles and control nozzles are provided in a staggered manner.
Figure 5A:
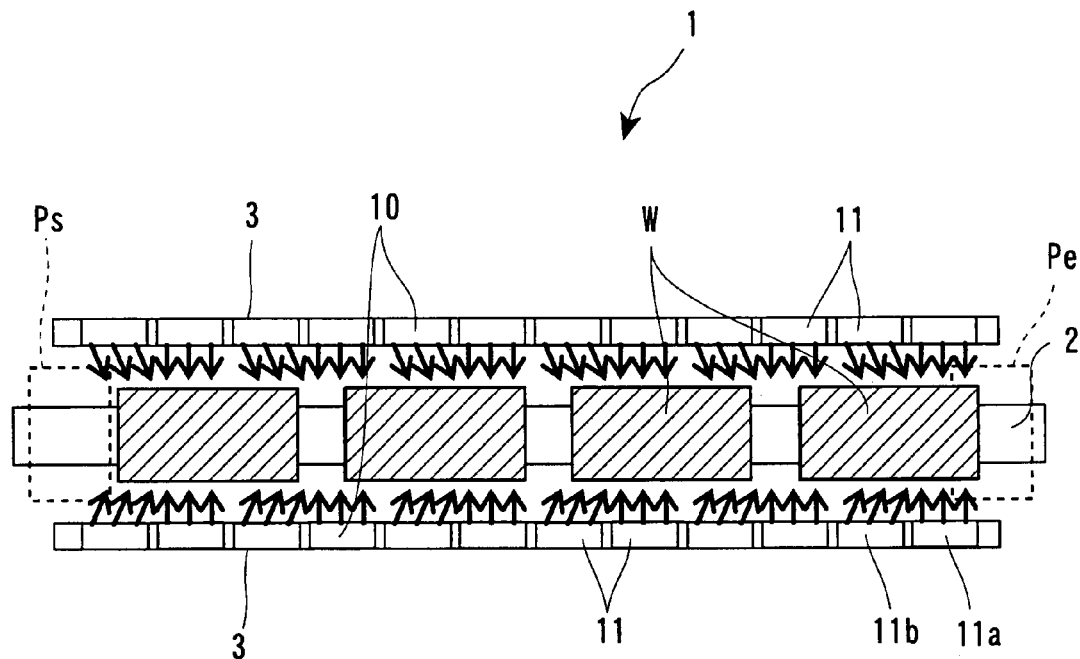
FIGS. 5A to 5C are explanatory drawings of the workpiece conveyor in which a width of workpiece conveying path is formed narrow.
Figure 5B:
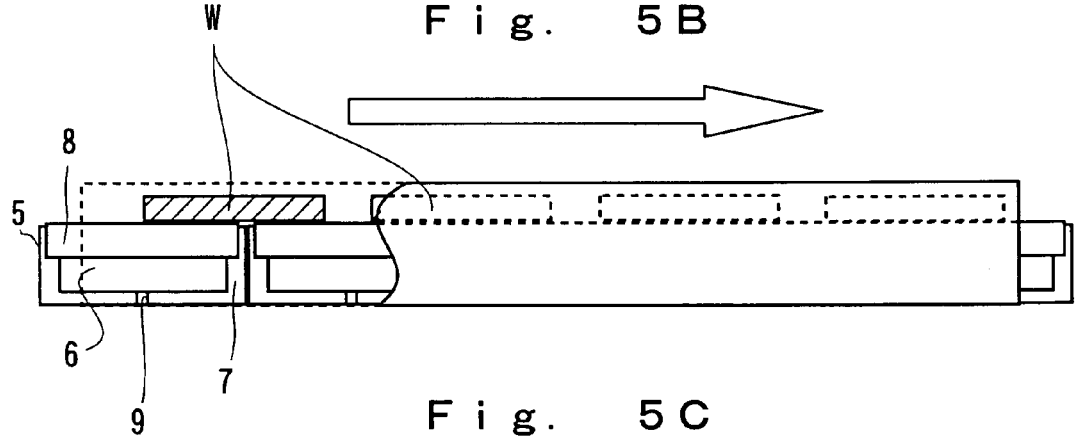
Figure 5C:
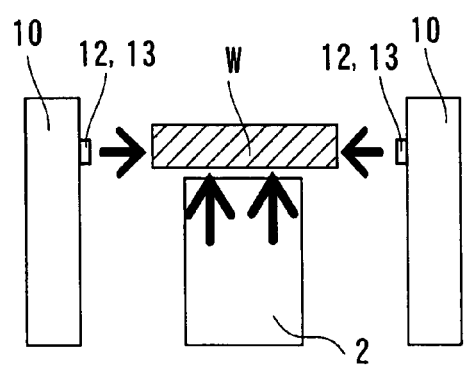

As described above, it is possible to blow air to both side surfaces of the workpiece W to give propulsion uniformly to the workpiece with a simple configuration. Therefore, the workpiece can be conveyed while being prealigned without deviating from the workpiece conveying path 2. Note that the plurality of control nozzles 12 and propulsion nozzles 13 may be densely arranged as they get closer to the conveyance ending position Pe. It is also possible to provide each of the plurality of control nozzles 12 and propulsion nozzles 13 with the flow regulating valve or the like for increasing the amount of blowing air as they get closer to the conveyance ending position Pe instead of changing intervals between the nozzles 12 and those between the nozzles 13. Accordingly, the workpiece W can be prealigned more accurately at the central area of the workpiece conveying path 2 as it approaches the conveyance ending position Pe. Furthermore, air may be blown to the workpiece W when the workpiece w is under conveyance, at rest, or even at all times. Moreover, although the respective control divided boxes 11a and propulsion divided boxes 11b are provided opposite to each other in the present embodiment, they may also be provided in a staggered manner (see FIG. 2). Accordingly, the propulsion nozzles 13 always face the workpiece W, whereby the workpiece W is given propulsion all the time and can be conveyed at a constant speed. Furthermore, the pair of air-blowing units 3 may be composed only of the propulsion nozzles 13 (propulsion divided boxes 11b). Moreover, the width of the workpiece conveying path 2 may be formed narrower than that of the workpiece W as shown in FIGS. 5A to 5C. Accordingly, the workpiece conveying path 2 can be made small in size, with a result of the compact workpiece conveyor 1. In this case, the width of the workpiece conveying path 2 is preferably formed wider than one-half the width of the workpiece W to prevent the workpiece W from falling.

Figure 3:
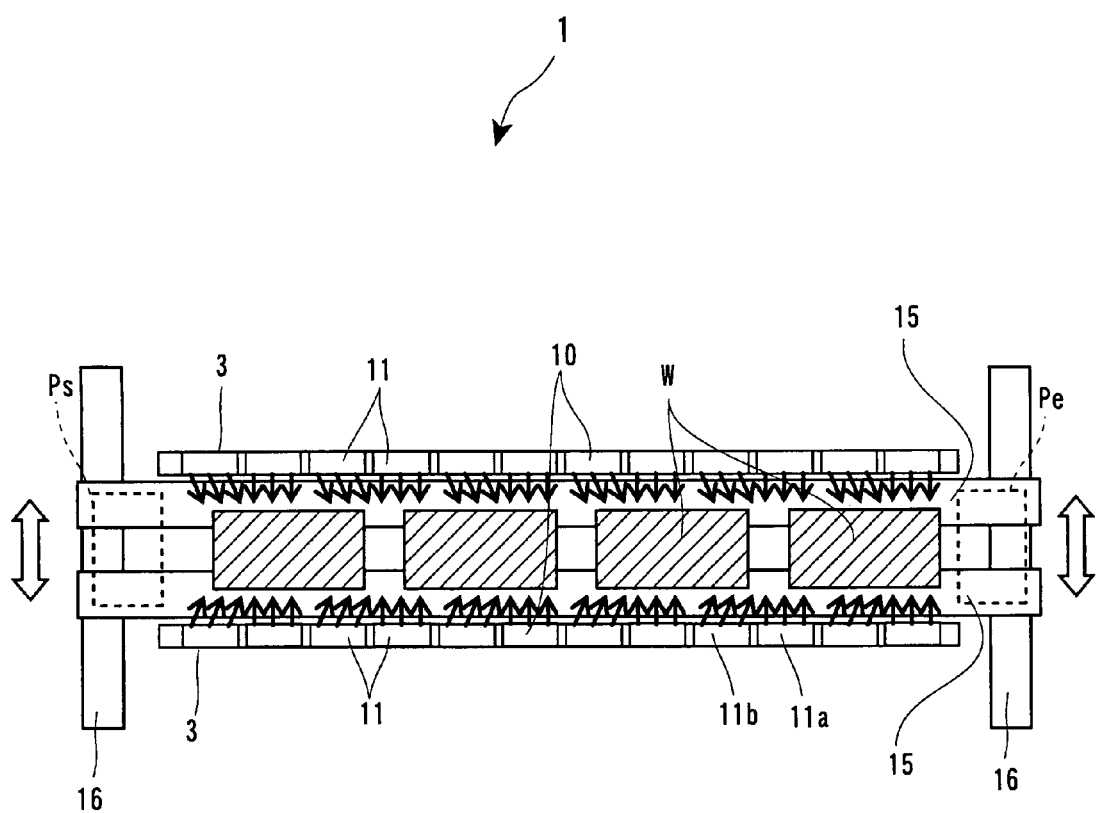
FIG. 3 is an explanatory drawing of the workpiece conveyor according to a first modified example of the first embodiment.

Furthermore, as a modified example of the present embodiment, the workpiece conveying path 2 may be composed of a pair of divided conveying paths 15 on which the workpiece W is straddlingly mounted, as shown in FIG. 3. In other words, the pair of divided conveying paths 15 have separation distance adjusting mechanisms 16, each provided at the front and rear parts thereof in the conveying direction. The separation distance adjusting mechanisms 16 adjust a separation distance between the pair of divided conveying paths 15 while keeping their parallel state, thereby making it possible to perform the conveyance of the workpiece W in accordance with the size of the workpiece W. More specifically, a separation distance between both divided conveying paths 15 is made wide for the conveyance of a large workpiece W, while it is made narrow for the conveyance of a small one.

Figure 4:
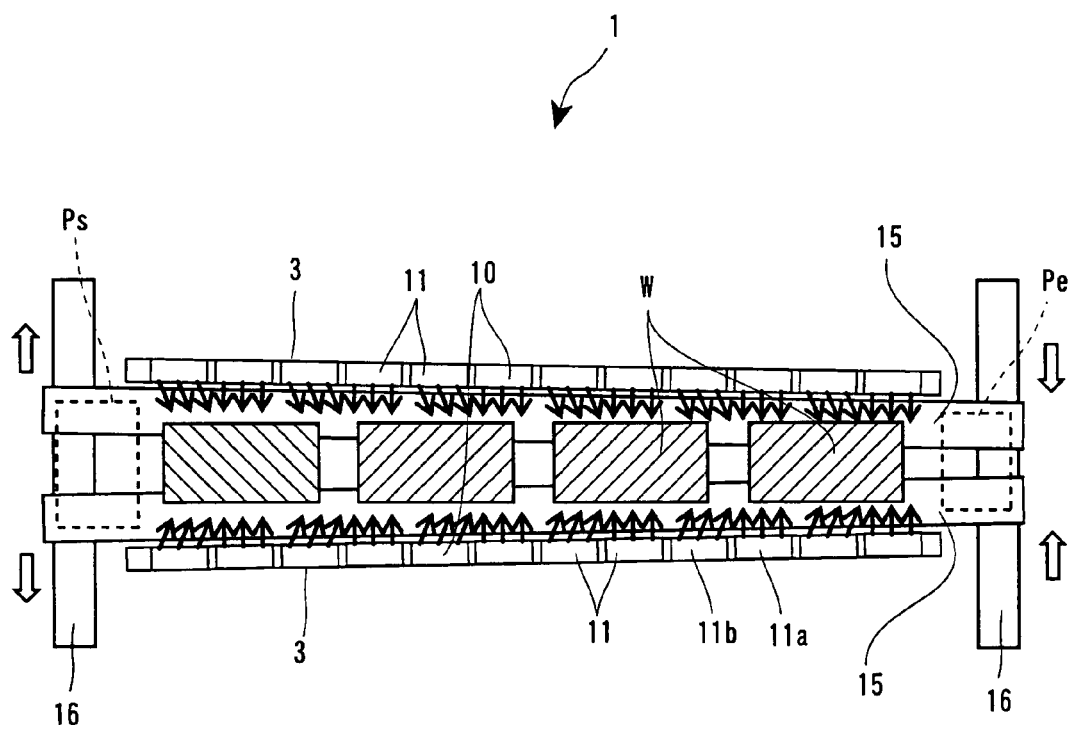
FIG. 4 is an explanatory drawing of the workpiece conveyor according to a second modified example of the first embodiment.

As shown in FIG. 4, the workpiece conveyor 1 may be so arranged that the pair of divided conveying paths 15 are disposed to extend non-parallel to each other and taperingly in a truncated chevron shape and the separation distance adjusting mechanism 16 is provided at the front and rear parts of the pair of divided conveying paths 15 in the conveying direction. Accordingly, when the workpiece W starts to be conveyed after being mounted straddlingly on the pair of divided conveying paths 15, it receives an increasing amount of air at both side surfaces as its conveyance gets going, which makes it possible for the workpiece W to be placed at the conveyance ending position Pe in an accurately prealigned state.

Figure 6A:
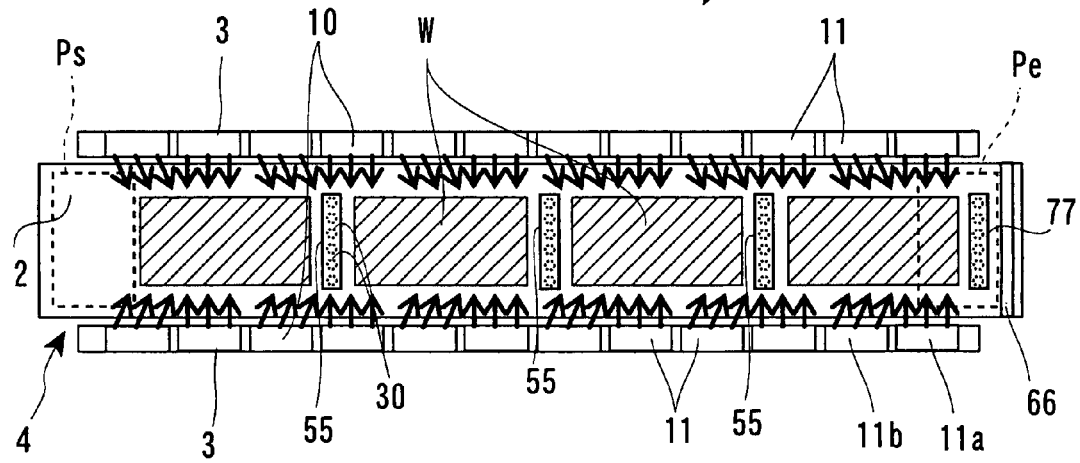
FIGS. 6A to 6C are explanatory drawings of a workpiece conveyor according to a second embodiment.
Figure 6B:
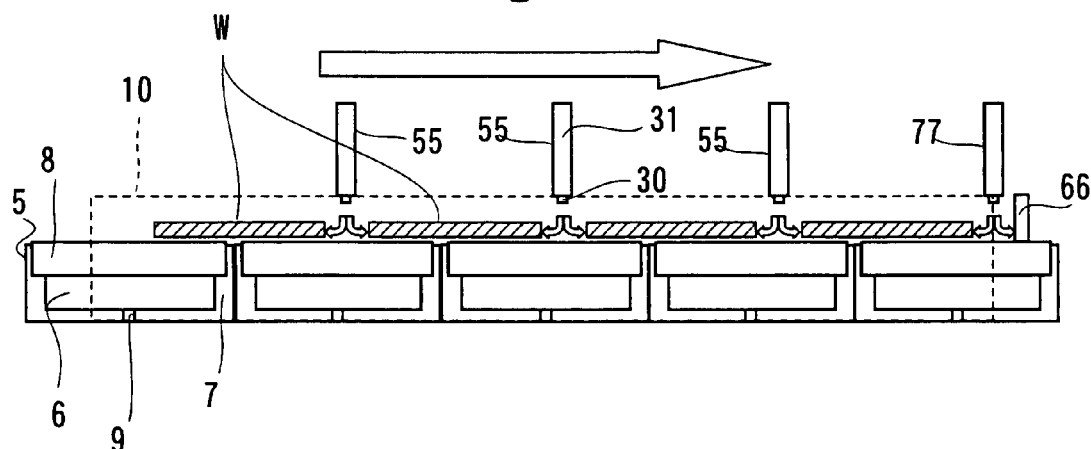
Figure 6C:
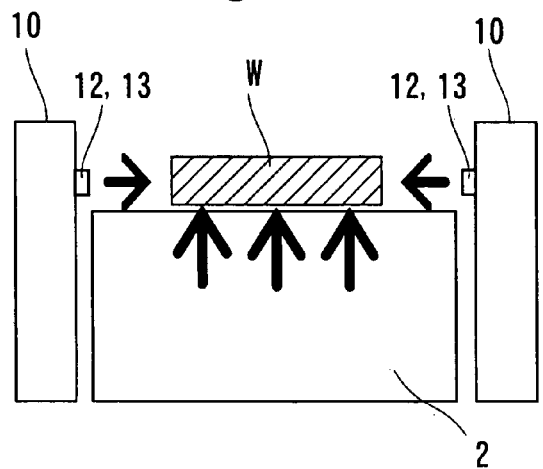

Referring next to FIGS. 6A to 6C, a description will be made about the workpiece conveyor of a second embodiment. Note that only different parts will be described herein to avoid overlaps. The workpiece conveyor 1 includes: a workpiece conveying mechanism 4 composed of the above-described workpiece conveying path 2 serving as a conveying path for a plurality of workpieces W and composed of the above-described pair of air-blowing units 3 which are standingly provided along both sides of the workpiece conveying path 2 and give propulsion to the workpiece W; a plurality of intermediate air-dropping units 55 which are disposed above the workpiece conveying path 2 and maintain gaps between the plurality of conveyed workpieces W; a baffle plate 66 which is disposed ahead of the conveyance ending position Pe of the workpiece conveying path 2 and extends in a direction orthogonal to the conveying direction; and an end air-dropping unit 77 which blows air from above to the gap between the baffle plate 66 and the workpiece W having reached the conveyance ending position Pe. The pair of air-blowing units 3 extend slightly shorter in length than the workpiece conveying path 2 from the conveyance starting position Ps to the conveyance ending position Pe along the workpiece conveying path 2, and blow air to the workpiece W conveyed by the workpiece conveying path 2 for propulsion.

The respective intermediate air-dropping units 55 are downwardly provided at uniform intervals above the workpiece conveying path 2 to face the front and rear sides of the conveyed workpieces W. Note that the respective intervals refer to, for example, a length obtained by adding the length of the workpiece W in the conveying direction and the gap to be maintained between the workpieces W. The respective intermediate air-dropping units 55 blow air downwardly in the vertical direction and include a plurality of air-dropping nozzles 30 provided in line in a direction orthogonal to the conveying direction and an air-dropping box 31 communicating with the air-dropping nozzle 30. The respective air-dropping boxes 31 are connected with a compressed air supplying unit of the plant through a flow regulating valve or the like (not shown). Accordingly, the amount of air from the plurality of air-dropping nozzles 30 can be regulated by the flow regulating valve or the like to make the respective gaps between the plurality of workpieces W uniform.

The end air-dropping unit 7 has the same configuration as that of the intermediate air-dropping units 55 and is disposed to blow air downwardly in the vertical direction to the gap between the baffle plate 66 provided ahead of the workpiece conveying path 2 and the workpiece w having reached the conveyance ending position Pe. In this case, the air blown into the gap between the baffle plate 66 and the workpiece W makes it possible to prealign the workpiece W in the conveying (longitudinal) direction at the stop (transfer) position thereof. In other words, the workpiece W is caused to stop at a predetermined transfer position by adjusting the position of the baffle plate 66 or the intensity of air from the end air-dropping unit 7.

When the workpiece W is mounted on the workpiece conveying path 2 at the conveyance starting position Ps, air is blown to both side surfaces of the workpiece W from the pair of air-blowing units 3, and the mounted workpiece W is conveyed while being prealigned. After the workpiece W previously mounted has moved in the conveying direction, the following workpiece W is mounted on the workpiece conveying path 2 at the conveyance starting position Ps with a regular interval away from the preceding workpiece W previously mounted and is then moved in the conveying direction. When the preceding workpiece W reaches the conveyance ending position Pe in a prealigned state, air is blown to the workpiece conveying path 2 from above from the end air-dropping unit 77. When the air is blown against the workpiece conveying path 2, it is branched and flowed to the forward and backward sides in the conveying direction. The air flowed to the forward side is blown against the baffle plate 66, while that flowed to the backward side is blown against the front surface of the preceding workpiece W. Simultaneously, air is blown to the workpiece conveying path 2 from above from the intermediate air-dropping units 55 and the air branched to the forward side is blown against the rear surface of the preceding workpiece W.

The preceding workpiece W is thus forced to move backwardly. However, since the preceding workpiece W is given the propulsion by the air from the air-blowing units 3 and the blowing force by the air from the intermediate air-dropping unit 55, it is positioned at a point where the blowing force by the air from the end air-dropping unit 77 is balanced with the propulsion by the air from the air-blowing units 3 and that from the intermediate air-dropping unit 55, having the gap between the workpiece W and the baffle plate 66, and is stopped (in a standby state) at the conveyance stopping position Pe. In other words, the preceding workpiece W is longitudinally and laterally prealigned by the pair of air-blowing units 3, the intermediate air-dropping unit 55, and the end air-dropping unit 77. Thereafter, when the following workpiece W approaches the preceding one, air is blown into the gap between the preceding and following workpieces W from above from the intermediate air-dropping unit 55. In the same manner as the above, the air is branched and flowed to the forward and backward sides in the conveying direction. The air flowed to the forward side is blown against the rear surface of the preceding workpiece W also serving as the baffle plate 66, while that flowed to the backward side is blown against the front surface of the following one. The following workpiece W is thus stopped (in a standby state) having the gap between the preceding and following workpieces W.

According to the above configuration, the respective gaps between the plurality of workpieces W can be maintained by air without causing the workpieces W to physically contact each other even if one or more workpieces W are in a standby state. Therefore, the workpieces W are prevented from contacting each other. Furthermore, the workpiece W at the conveyance ending position Pe is in a prealigned state by the intermediate air-dropping unit 55, the end air-dropping unit 77, and both air blowing units 3 and 3. Since the prealigned workpiece W is once sucked on the actuating air plate 5 of the workpiece conveying path 2 and waits to be transferred, it can be transferred to a processing device or the like as it is.

Figure 7A:
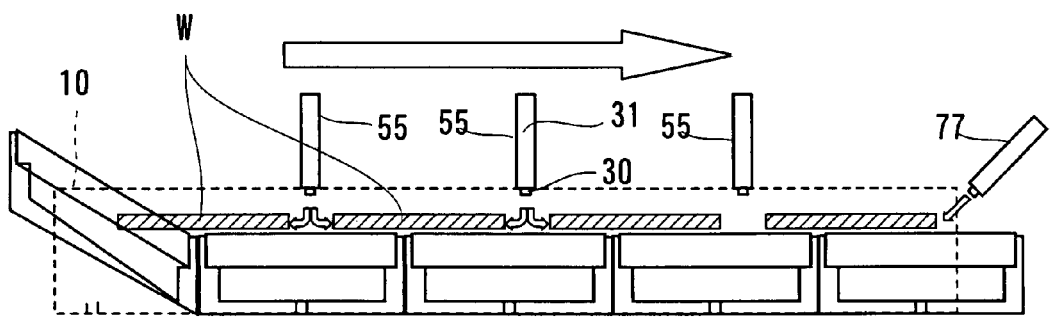
FIGS. 7A and 7B are explanatory drawings of a modified example of the workpiece conveyor according to the second embodiment.
Figure 7B:
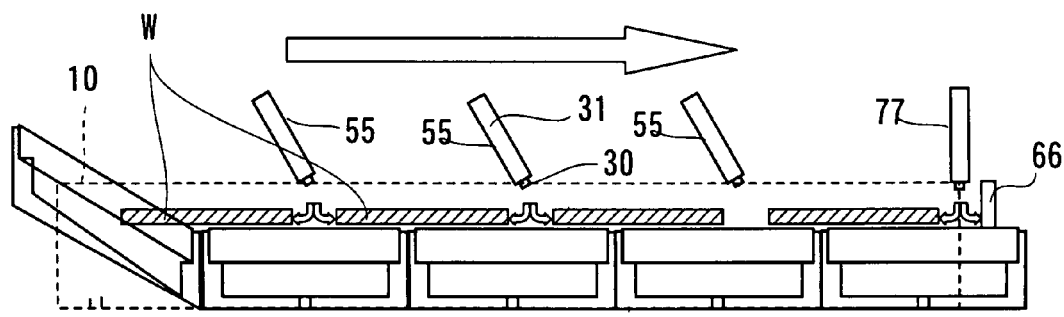

In the present embodiment, air is blown into the gap between the workpiece W and the baffle plate 66 from above from the end air-dropping unit 77. As shown in FIG. 7A, however, it is possible to eliminate the baffle plate 66 and dispose the end air-dropping unit 77 on the forward side of the workpiece conveying path 2 in the conveying direction such that air is blown obliquely backward from above. It is also possible to substitute a slit-like air-dropping nozzle for the plurality of air-dropping nozzles 30 provided in line. As shown in FIG. 7B, it is furthermore possible to make the respective intermediate air-dropping units 55 blow air obliquely forward in the conveying direction. Accordingly, when air is blown to the workpiece W during the conveyance, for example, it can be relatively blown to the workpiece W from above by matching the conveyance speed of the workpiece W to the air blowing angle. Therefore, the gap between the workpieces w can be properly maintained during the conveyance. Furthermore, the plurality of intermediate air-dropping units 55 and the end air-dropping unit 77 may blow air all the time or at a time when the preceding workpiece W is in a standby state and the following one approaches.

Figure 8A:
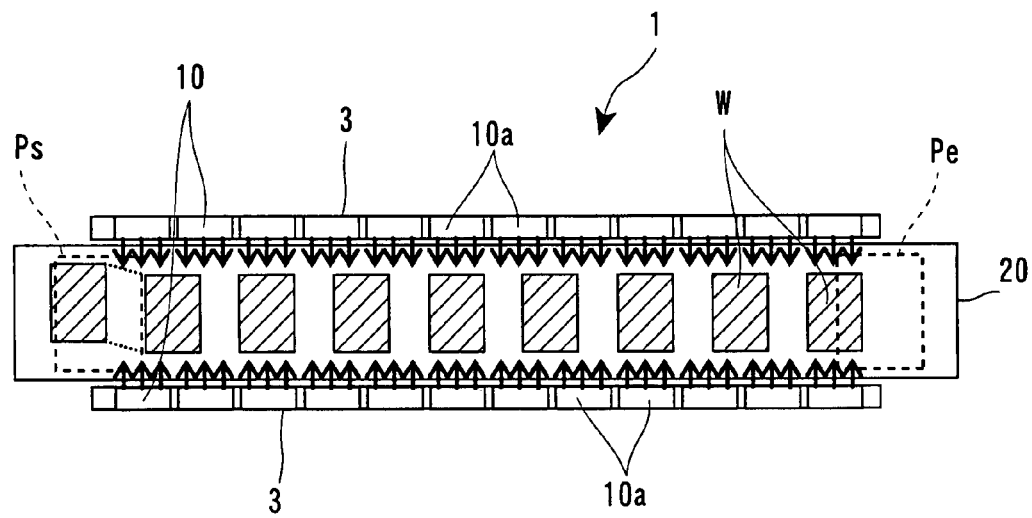
FIGS. 8A to 8C are explanatory drawings of a workpiece conveyor according to a third embodiment.
Figure 8B:
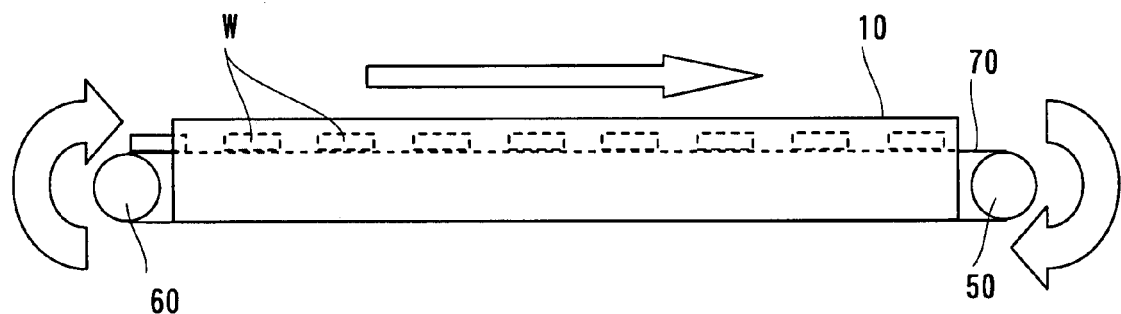
Figure 8C:
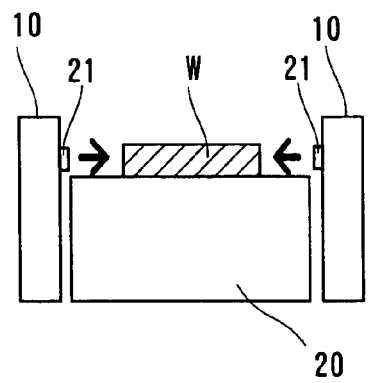

Referring next to FIGS. 8A to 8C, a description will be made about the workpiece conveyor according to a third embodiment. The workpiece conveyor used herein has a workpiece such as a glass substrate used with a liquid crystal panel mounted on a belt conveyor and conveys the same. At that time, the workpiece conveyor makes it possible to perform prealignment of the workpiece. The workpiece conveyor 1 includes a belt conveyor 20 and the pair of air-blowing units 3 standingly provided along both sides of the belt conveyor 20. The pair of air-blowing units 3 extend slightly shorter in length than the belt conveyor 20 from the conveyance starting position Ps to the conveyance ending position Pe of the belt conveyor 20 and blow air to the workpiece W conveyed by the belt conveyor 20 from both sides.

The belt conveyor 20 includes: a driving pulley 50 which is rotated by a driving motor (not shown) through a reduction gear train or the like; a driven pulley 60 which is driven by the driving pulley 50; and an endless conveying belt 70 which goes around the driving pulley 50 and the driven pulley 60. The belt conveyor 20 makes the conveying belt 70 travel between the driving pulley 50 and the driven pulley 60, thereby conveying the workpiece W (plurality of workpieces W in the embodiment) mounted on the conveying belt 70 from the conveyance starting position Ps to the conveyance ending position Pe. Although the belt conveyor 20 conveys the plurality of workpieces w at a time in its operation, the conveyance is caused to stop as needed when the workpiece W is supplied (mounted) at the conveyance starting position Ps or is removed (transferred) at the conveyance ending position Pe. The conveyance is also caused to stop when a processing unit disposed at a midway point of the conveying belt 70 accesses the workpiece W. In other words, the belt conveyor 20 conveys the workpieces w while repeating the conveying and the stopping operations. Note that the conveying belt 70 has preferably a small friction resistance to (the mounting surface of) the workpiece W such that the workpiece W is easily moved by the air from the air-blowing units 3.

The pair of air-blowing units 3 include: the pair of rectangular air boxes 10 which are disposed along both sides of the belt conveyor 20 and extend from the conveyance starting position Ps to the conveyance ending position Pe; and a plurality of groups of blowing nozzles 21 which are provided to communicate with the respective air boxes 10 and opposite to each other sandwiching the belt conveyor 20. The respective air boxes 10 are divided in the longitudinal direction to form plural pieces of divided air boxes 10a. The respective divided boxes 10a thus formed are provided with three (a plurality of) blowing nozzles 21. The plurality of divided boxes 10a are respectively connected with a compressed air supplying unit (not shown) of the plant through a flow regulating valve (not shown) or the like. The air supplied from the compressed air supplying unit is blown to the workpiece W from the respective blowing nozzles 21 through the respective divided boxes 10a. The respective blowing nozzles 21 of both air boxes 10 and 10 are aligned at a position orthogonal to the conveying direction to make a pair (pairs). The air from the plurality of pairs (groups) of blowing nozzles 21 is regulated to be uniformly blown to both side surfaces of the workpiece W. Note that the flow regulating valve or the like is preferably provided in each of the blowing nozzles 21.

The plurality of blowing nozzles 21 of the respective air boxes 10 are provided in line at the upper portion of the respective air boxes 10 from the conveyance starting position Ps to the conveyance ending position Pe such that they can be arranged at uniform intervals. The air blowing angle is so adjusted that the blowing nozzles 21 may intersect perpendicularly to the conveying direction of the belt conveyor 20. The interval between the plurality of blowing nozzles 21 is set to the length shorter than one-half the length of the side surface of the workpiece W, whereby air is blown to the workpiece W from at least two groups of the blowing nozzles 21. Note that the three blowing nozzles 21 of the respective divided boxes 10a may be integrally formed in a slit-like shape, or the plurality of blowing nozzles 21 of the respective air boxes 10 may be integrally formed in a slit-like shape. Or else, the angle of the blowing nozzles 21 may be adjusted such that air is blown at right angles relative to the workpiece W under movement (conveyance). Furthermore, the blowing nozzles 21 are designed to correspond in height to the vertically intermediate position of the workpiece W as shown in FIG. 8C. Note, however, that it is also possible to tilt the blowing nozzles 21 slightly downward such that air may be blown to the workpiece W in a slightly downward direction, causing a lifting force to act on the workpiece W.

When the workpiece W is mounted on the conveying belt 70 at the conveyance starting position Ps and starts to be conveyed, air is uniformly blown to both side surfaces of the workpiece W from the plurality of groups of blowing nozzles 21 facing both sides of the workpiece W. Then, the workpiece W is gradually blown toward the central area between both blowing nozzles 21 and 21 making a pair, namely, the central area of the conveying belt 70 while being conveyed by the conveying belt 70. At this time, the posture of the workpiece is controlled to follow its course in the conveying direction. In other words, the workpiece W is conveyed while being gradually prealigned and finally reaches the conveyance ending position Pe in a prealigned state. Thereafter, the workpiece W is transferred to the next-stage apparatus by a pick-up device or the like which picks up an object by vacuum suction.

Figure 9A:
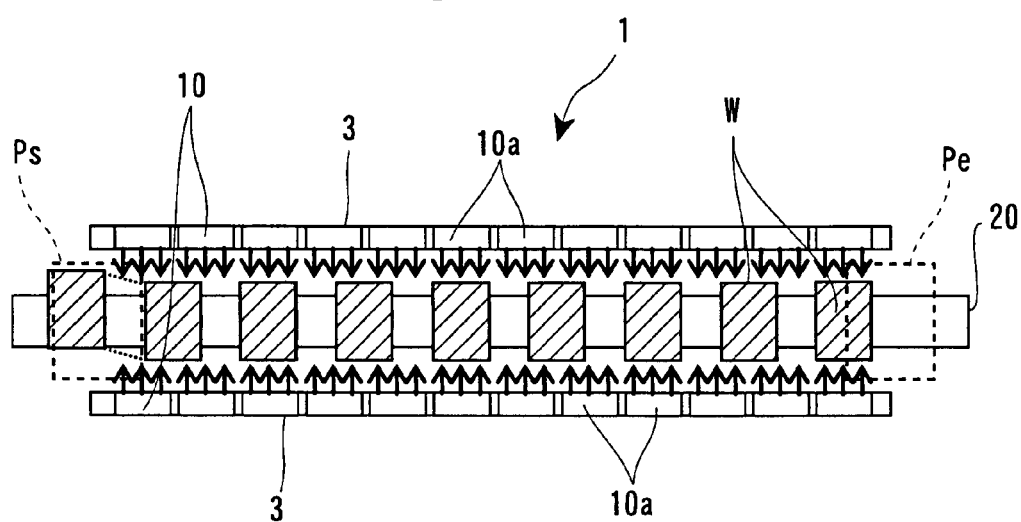
FIGS. 9A to 9C are explanatory drawings of the workpiece conveyor in which a belt is formed narrow.
Figure 9B:
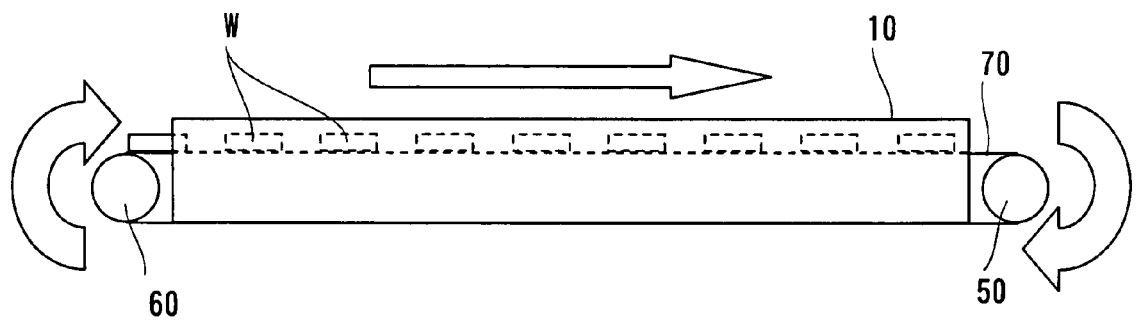
Figure 9C:
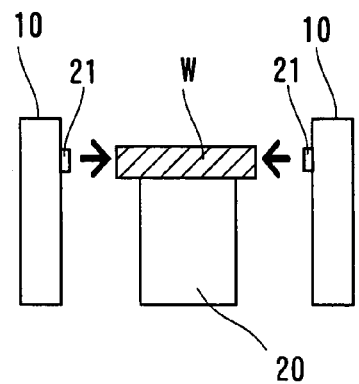

According to the above configuration, since the workpiece W is free from contact with a pin or the like when it is conveyed, it can be prealigned without being given any damage. Therefore, it is not necessary to install a dedicated apparatus, etc., which performs prealignment of a workpiece, at the conveyance ending position Pe prior to the transfer of the workpiece W. Although the blowing nozzles 21 are arranged at uniform intervals in the present embodiment, they may be densely arranged as they get closer to the conveyance ending position Pe. It is furthermore possible for the blowing nozzles 21 closer to the conveyance ending position Pe to blow an increased amount of air with the above-described flow regulating valve (control valve) without changing the intervals. Accordingly, the workpiece W can be accurately prealigned as it approaches the conveyance ending position Pe. Furthermore, air may be blown to the workpiece W when the workpiece W is under conveyance, at rest, or even at all times. Moreover, the width of the conveying belt 70 may be formed narrower than that of the workpiece W as shown in FIG. 9. Accordingly, the belt conveyor 20 can be made small in size, with a result of the compact workpiece conveyor 1. In this case, the width of the conveying belt 70 is preferably formed wider than one-half the width of the workpiece W to prevent the workpiece W from falling.

Figure 10A:
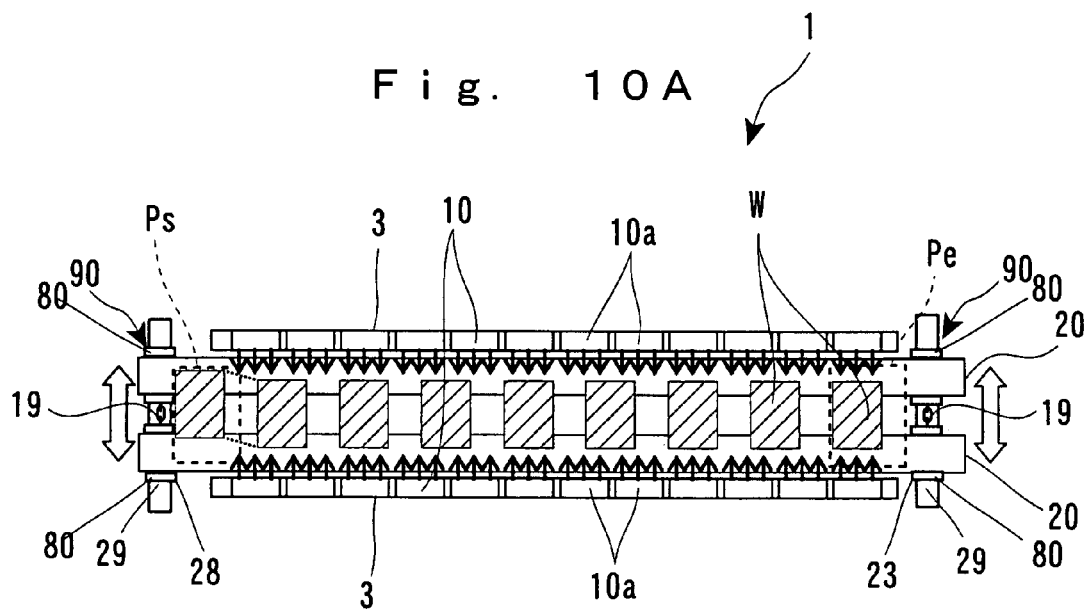
FIGS. 10A to 10C are explanatory drawings of a workpiece conveyor according to a fourth embodiment.
Figure 10B:
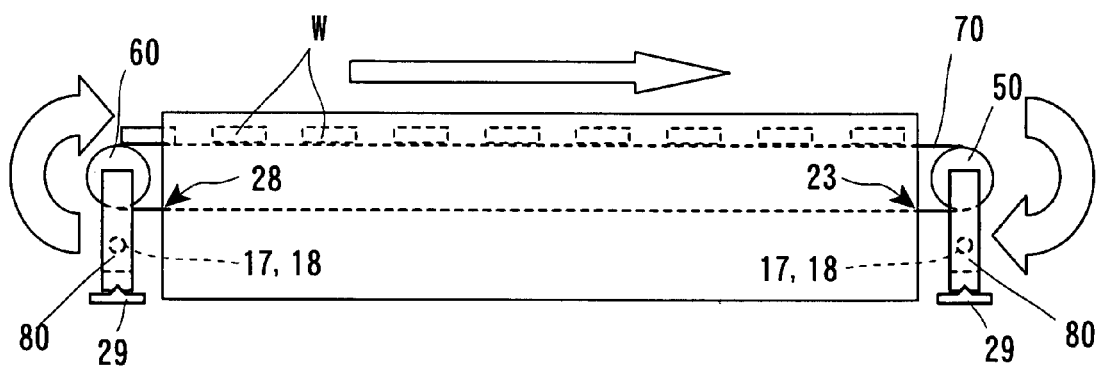
Figure 10C:
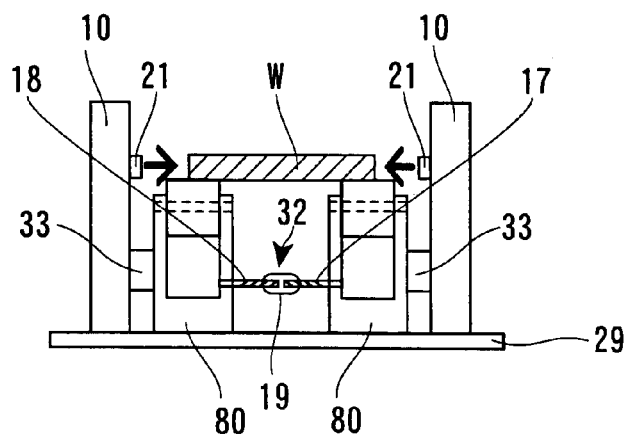

Referring next to FIGS. 10A to 10C, a description will be made about the workpiece conveyor according to a fourth embodiment. The workpiece conveyor 1 includes: the pair of belt conveyors 20 on which the workpiece w is straddlingly mounted and conveyed; separation distance adjusting mechanisms 90 which are provided at the front and rear parts of the pair of belt conveyors 20 in the conveying direction and adjust a separation distance between the pair of belt conveyors 20; and the pair of air-blowing units 3 provided along both sides of the pair of belt conveyors 20. The pair of air-blowing units 3 extend slightly shorter in length than the pair of belt conveyors 20 from the conveyance starting position Ps to the conveyance ending position Pe of the pair of belt conveyors 20 and blow air to the workpiece W conveyed by the pair of belt conveyors 20.

The respective belt conveyors 20 include: the driving pulley 50 which is rotated by a driving motor (not shown) through a reduction gear train or the like; the driven pulley 60 which is driven by the driving pulley 50; and the endless conveying belt 70 which goes around the driving pulley 50 and the driven pulley 60, all of which are supported by a pair of front and rear supporting legs 80 which are formed substantially in U-shape and rotatably support the respective pulleys 50 and 60. The driving motors of both belt conveyors 20 rotate synchronously such that both conveying belts 70 and 70 respectively have the same peripheral (conveying) speed. Accordingly, the workpiece W mounted straddlingly on both conveying belts 70 and 70 is conveyed with its posture controlled. By making both conveying belts 70 travel simultaneously between the driving pulley 50 and the driven pulley 60, the workpiece W (plurality of workpieces W in the embodiment) mounted on both conveying belts 70 is (are) conveyed from the conveyance starting position Ps to the conveyance ending position Pe.

Although the belt conveyors 20 convey the plurality of workpieces W at a time in its operation, the conveyance is caused to stop as needed when the workpiece W is supplied (mounted) at the conveyance starting position Ps or is removed (transferred) at the conveyance ending position Pe. The conveyance is also caused to stop when a processing unit disposed at a midway point of the conveying belt 70 accesses the workpiece W. In other words, the belt conveyors 20 convey the workpieces W while repeating the conveying and the stopping operations. Note that the conveying belt 70 has preferably a small friction resistance to (the mounting surface of) the workpiece W such that the workpiece W is easily moved by the air from the air-blowing units 3.

The pair of air-blowing units 3 include: the pair of rectangular air boxes 10 which are disposed along both sides of the belt conveyors 20 and extend from the conveyance starting position Ps to the conveyance ending position Pe; and a plurality of groups of blowing nozzles 21 which are provided to communicate with the respective air boxes 10 and opposite to each other sandwiching the belt conveyors 20. The respective air boxes 10 are divided in the longitudinal direction to form plural pieces of divided air boxes 10a. The respective divided boxes 10a thus formed are provided with three (a plurality of) blowing nozzles 21. The plurality of divided boxes 10a are respectively connected with a compressed air supplying unit (not shown) of the plant through a flow regulating valve (not shown) or the like. The air supplied from the compressed air supplying unit is blown to the workpiece W from the respective blowing nozzles 21 through the respective divided boxes 10a. The respective blowing nozzles 21 of both air boxes 10 and 10 are aligned at a position orthogonal to the conveying direction to make a pair (pairs). The air from the plurality of pairs (groups) of blowing nozzles 21 is regulated to be uniformly blown to both side surfaces of the workpiece W. Note that the flow regulating valve or the like is preferably provided in each of the blowing nozzles 21.

The plurality of blowing nozzles 21 of the respective air boxes 10 are provided in line at the upper portion of the respective air boxes 10 from the conveyance starting position Ps to the conveyance ending position Pe such that they are arranged at uniform intervals. The air blowing angle is so adjusted that the blowing nozzles 21 may intersect perpendicularly to the conveying direction of the belt conveyor 20. The interval between the plurality of blowing nozzles 21 is set to the length shorter than one-half the length of the side surface of the workpiece W, whereby air is blown to the workpiece W from at least two groups of the blowing nozzles 21. Note that the plurality of blowing nozzles 21 may be densely arranged as they get closer to the conveyance ending position Pe. It is also possible to provide each of the plurality of blowing nozzles 21 with the flow regulating valve or the like for increasing the blowing amount of air as they get closer to the conveyance ending position Pe instead of changing intervals between the nozzles 21. Accordingly, the workpiece W can be prealigned more accurately at the central area of the pair of belt conveyors 2 as it approaches the conveyance ending position Pe. Furthermore, air may be blown to the workpiece W when the workpiece W is under conveyance, at rest, or even at all times.

The separation distance adjusting mechanisms 90 include: a front widening/narrowing moving mechanism 23 which is disposed at the front part of the pair of belt conveyors 20 in the conveying direction; a rear widening/narrowing moving mechanism 28 which is disposed at the rear part of the pair of belt conveyors 20 in the conveying direction; and a pair of front and rear guide rails 29 which slidably support the two groups of front and rear legs 80 of the pair of belt conveyors 20 in a direction orthogonal to the conveying direction. The pair of front and rear guide rails 29 have the respective air blowing-units 3 slidably supported thereon (as will be described in detail below).

The respective front and rear widening/narrowing moving mechanisms 23 and 28 are composed of a turnbuckle-like double thread screw mechanism 32. The double thread screw mechanism 32 includes: a left-hand external thread member 17 whose fixing-side end is fixed at the leg 80 of one belt conveyor 20; a right-hand external thread member 18 whose fixing-side end is fixed at the leg 80 of the other belt conveyor 20; and an internal thread block 19 whose both ends in the axial direction are threadedly engaged with the thread portions of the left-hand external thread member 17 and the right-hand external thread member 18 (see FIG. 10C). When the internal thread block 19 is normally or reversely rotated around the axis, both legs 80, namely, both belt conveyors 20 and 20 can be pulled in and pulled away relative to its center position. Note, however, that both belt conveyors 20 and 20 of the embodiment are respectively connected with the air-blowing unit 3 through a connecting member 33: both belt conveyors 20 and 20 are pulled in and pulled away together with the air-blowing unit 3 by the double thread screw mechanism 32.

As described above, a separation distance between both belt conveyors 20 and 20 can be adjusted by the front and rear widening/narrowing moving mechanisms 23 and 28. Accordingly, a separation distance between both belt conveyors 20 and 20 is made wide for the conveyance of a large workpiece W, while it is made narrow for the conveyance of a small one. As a result, the workpiece W can be properly conveyed without the use of a large belt conveyor in accordance with the workpiece W of the maximum size. Furthermore, the workpiece W can be prealigned at the central area of the belt conveyors 20 while being conveyed, by the pair of air-blowing units 3.

Note that each of the internal thread blocks 19 is preferably provided with a scale plate. In this way, when the internal thread blocks 19 are rotated using the scale of the scale plate as a guide, it is possible to easily match a separation distance between both belt conveyors 20 and 20 at the end on the conveyance ending position Pe side, which is adjusted by the front widening/narrowing moving mechanism 23, to that on the conveyance starting position Ps side, which is adjusted by the rear widening/narrowing moving mechanism 28. In other words, it is possible to easily adjust the separation distance between both belt conveyors 20 and 20 while keeping their parallel state. Needless to say, the internal thread blocks 19 may be rotated normally or reversely either manually or automatically with a motor as a driving source. In addition, the separation distance adjusting mechanisms 90 may be provided with one or more intermediate widening/narrowing moving mechanisms, besides the front and rear widening/narrowing moving mechanisms 23 and 28.

Figure 11:
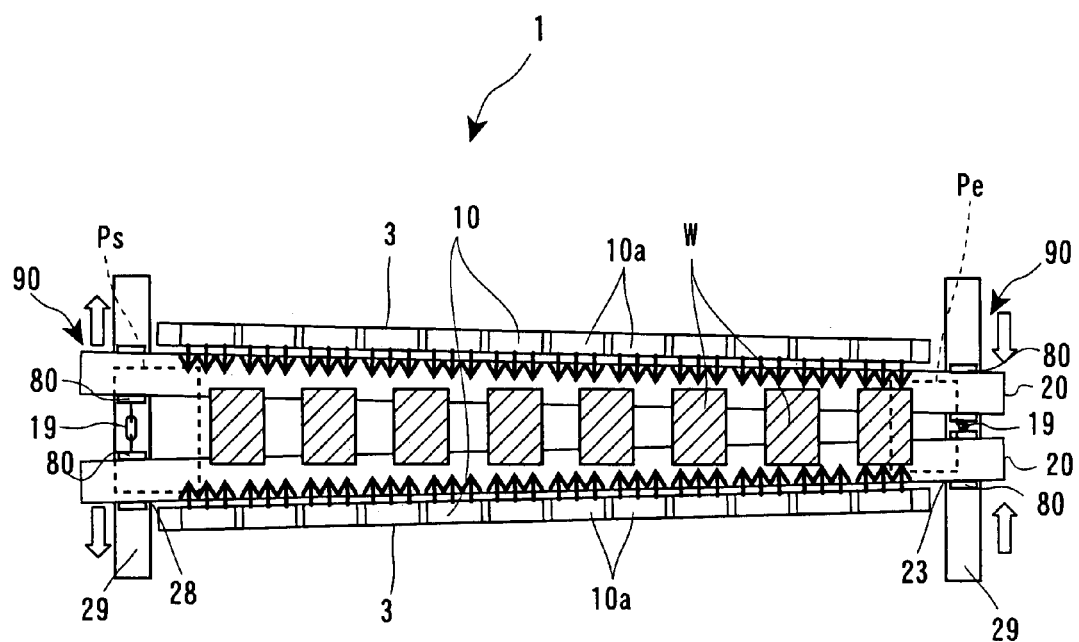
FIG. 11 is a top view of the workpiece conveyor in which a pair of belt conveyors are arranged in a truncated chevron shape.
Figure 12A:
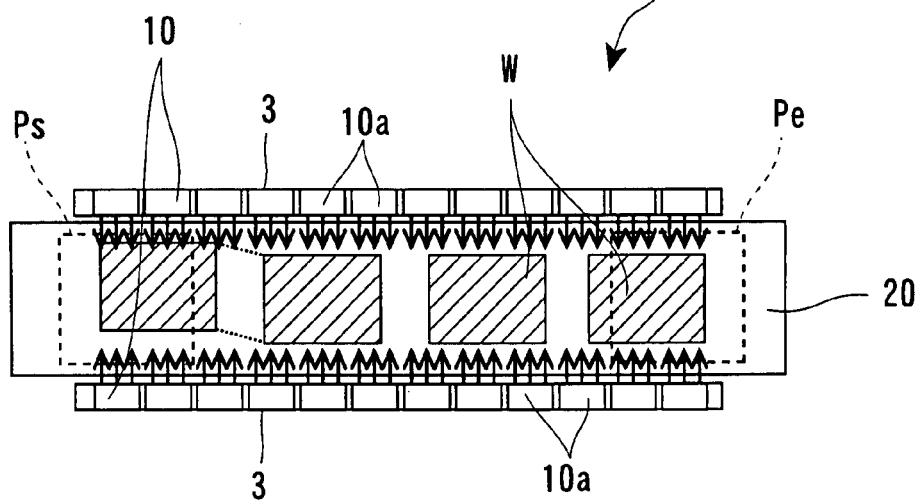
FIGS. 12A to 12C are explanatory drawings of the workpiece conveyor according to a modified example of the third embodiment.
Figure 12B:
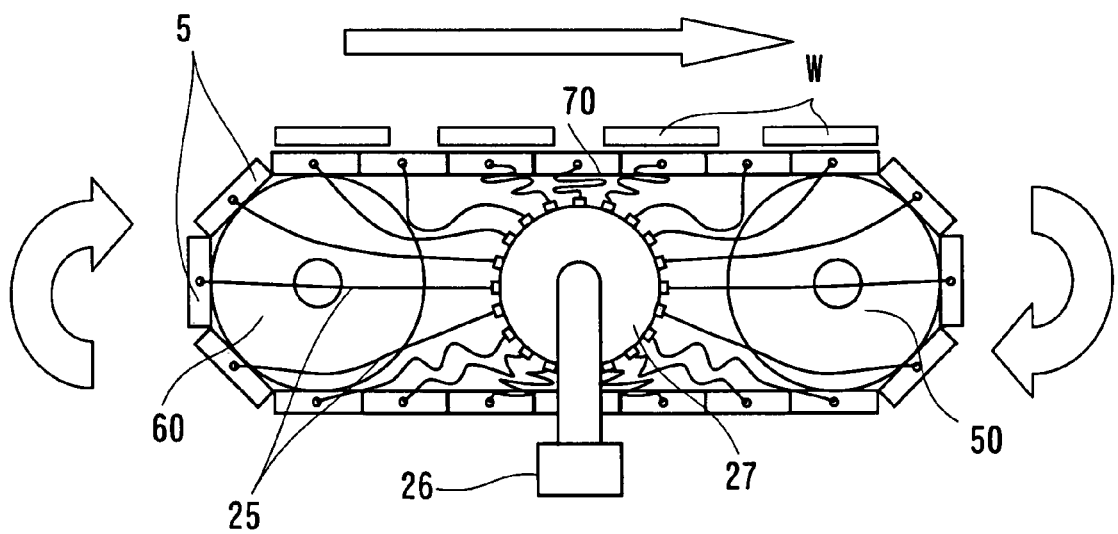
Figure 12C:
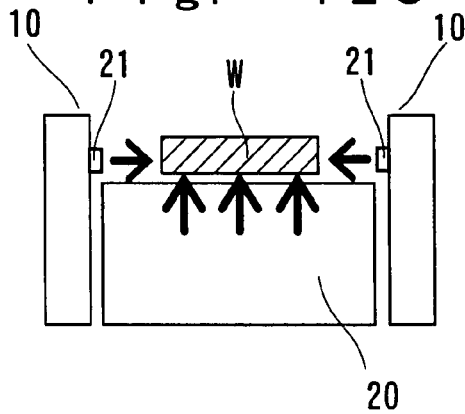
Figure 13A:
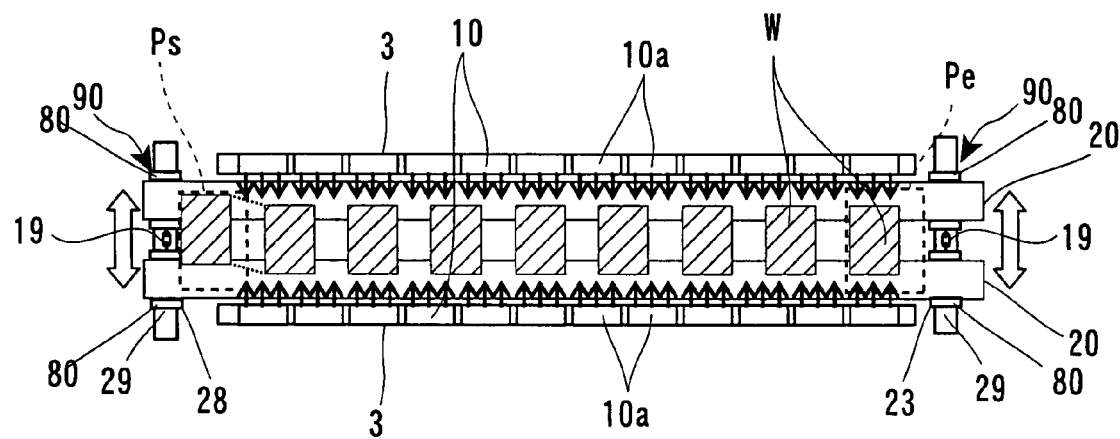
FIGS. 13A to 13C are explanatory drawings of the workpiece conveyor according to a modified example of the fourth embodiment.
Figure 13B:
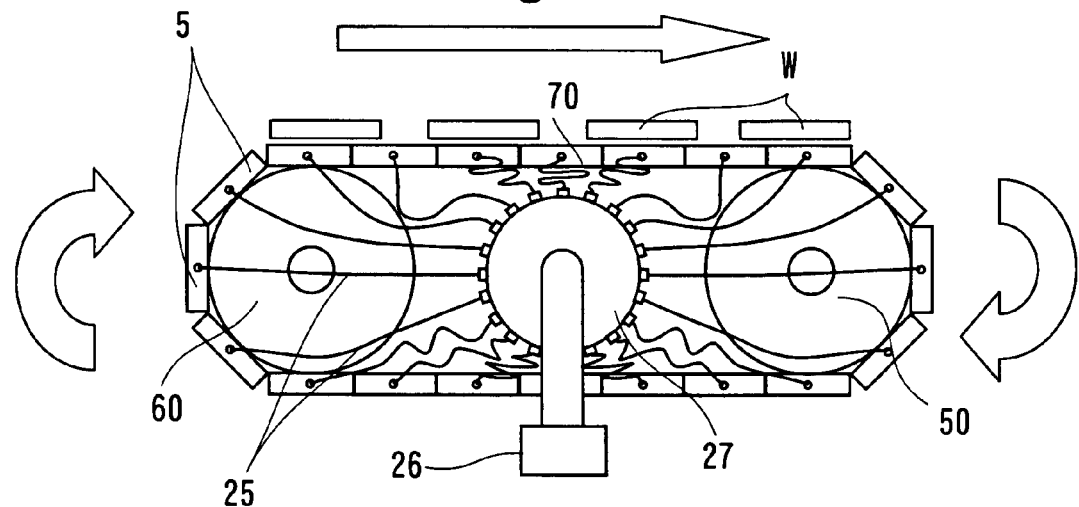
Figure 13C:
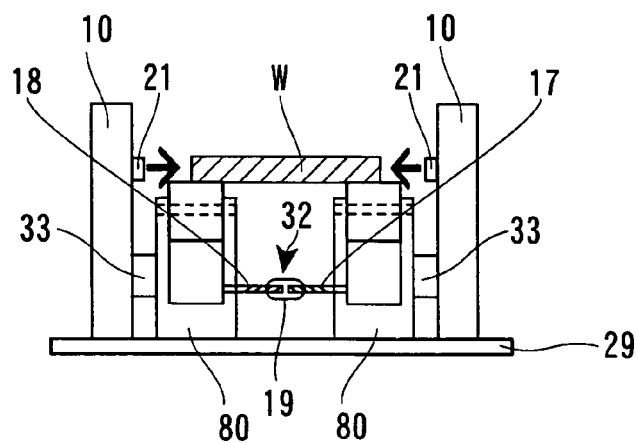

Referring next to FIG. 11, a description will be made about a modified example of the fourth embodiment. As shown in FIG. 11, although the modified example has the same configuration as that of the above-described fourth embodiment, it has the pair of belt conveyors 20 and 20 disposed nonparallel to each other and taperingly in a truncated chevron shape in the conveying direction with the separation distance adjusting mechanisms 90. In other words, a separation distance between the pair of belt conveyors 20 and 20 at the conveyance starting position Ps is made wide by the rear widening/narrowing moving mechanism 28, while that at the conveyance ending position Pe is made narrow by the front widening/narrowing moving mechanism 28.

When the workpiece W starts to be conveyed after being mounted straddlingly on the pair of belt conveyors 20 and 20, the workpiece W is conveyed while being brought to the central area by both conveying belts 70. In other words, the workpiece W is conveyed by both conveying belts 70 in such a manner that its mounting surface areas on the conveyor belts 70 may become the same. More specifically, if one mounting surface area is larger than the other, it will cause to increase frictional resistance. Therefore, the workpiece W is automatically brought to the central area of the pair of belt conveyors 20 in a well-balanced manner with one mounting surface fixed to the conveying belt 70 and the other made movable. Furthermore, since the plurality of groups of blowing nozzles 21 facing both sides of the workpiece W blow air uniformly to both side surfaces thereof, the workpiece W is gradually blown toward the central area of the pair of belt conveyors 20 and 20 with its posture controlled to follow its course in the conveying direction. The workpiece W is conveyed while being gradually prealigned and finally reaches the conveyance ending position Pe in a prealigned state. Thereafter, the workpiece W is transferred to the next-stage apparatus by a pick-up device or the like which picks up an object by vacuum suction. Accordingly, it is possible to perform accurate prealignment of the workpiece W without contacting the same and to pick up the workpiece W without the necessity of installing the unit for prealignment.

Referring next to FIGS. 12A to 12C and 13A to 13C, a description will be made about a modified example of the workpiece conveyor 1 of the third embodiment and the fourth embodiment. Note that only different parts will be described herein to avoid overlaps. In the workpiece conveyor 1, the conveying belt 70 of the respective belt conveyors 20 of the third and fourth embodiments has the plurality of actuating air plates 5 provided thereon. The plurality of actuating air plates 5 float the workpiece W slightly during the conveyance to facilitate the prealignment of the workpiece.

The plurality of actuating air plates 5 are fixed at the front surface of the conveying belt 70 while they are arranged in the conveying direction having no gap therebetween. In this case, the respective actuating air plates 5 are fixed at the intermediate position of the conveying belt 70 in a direction orthogonal to the conveying direction and can pass through the driving pulley 50 and the driven pulley 60 smoothly. Although omitted in the figures, a plurality of guide rollers are disposed between the driving pulley 50 and the driven pulley 60 to prevent the slack of the conveying belt 70. Note that the plurality of actuating air plates 5 may be directly connected to one another in a chain-like manner to form a conveying belt without using the conveying belt 70.

Figure 14A:
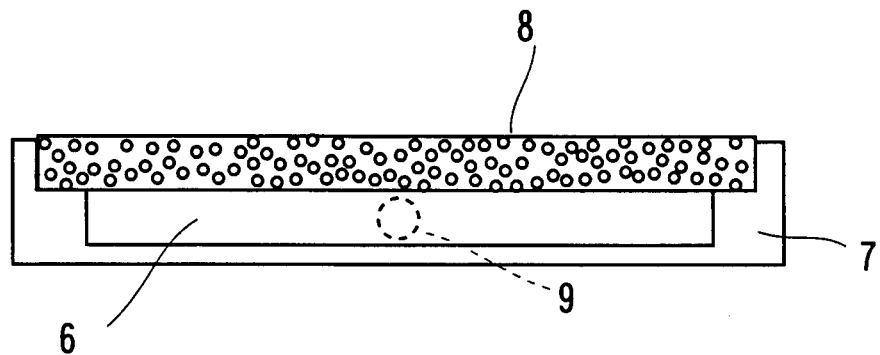
FIGS. 14A and 14B are schematic views of an actuating air plate.
Figure 14B:
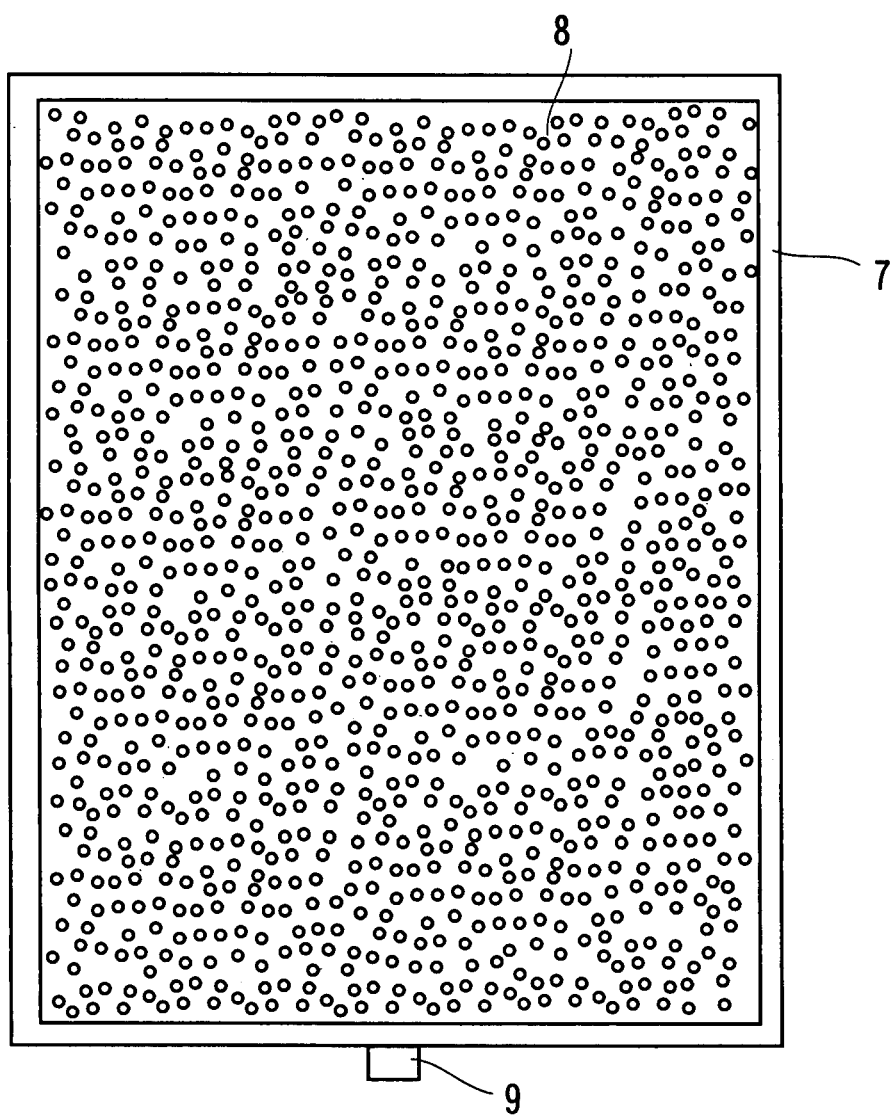

As shown in FIGS. 14A and 14B, the respective actuating air plates 5 are composed of the frame 7, the porous plate 8 fitted into the upper portion of the frame 7, and the air chamber 8 provided under the porous plate 8. Provided at the side surface of the frame 7 is the air connecting port 9 which communicates with an air supplying unit 26 described below. The porous plate 8 has a plurality of pores through which the compressed air of the air chamber 6 passes to float the workpiece W on the porous plate 8. The air connecting port 9 is connected to the air supplying unit 26 through an air supplying tube 25. The air supplied to the air chamber 9 from the air supplying unit 26 is upwardly blown from the whole top surface of the porous plate 8.

The use of the porous plate 8 makes it possible to blow air uniformly from the whole surface of the porous plate 8 with a relatively small amount of air. Note that the amount of air to be blown in this case may be such as to float the workpiece W slightly. Furthermore, interposed between the plurality of air supplying tubes 25 and the air supplying unit 26 is a rotary joint 27. When the plurality of air supplying tubes 25 are rotated as the conveying belt 70 and the plurality of actuating air plates 5 go around the driving pulley 50 and the driven pulley 60, the rotary joint 27 is accordingly rotated. It is therefore possible for the plurality of actuating air plates 5 to go around the driving pulley 50 and the driven pulley 60 without the entanglement of the plurality of air supplying tubes 25.

When the workpiece W is mounted on the respective belt conveyors 20 at the conveyance starting position Ps, it is floated by the air upwardly blown from the actuating air plate 5. At the same time, the air from the plurality of groups of blowing nozzles 21 facing both sides of the workpiece W is uniformly blown to both side surfaces of the workpiece W. Since the friction between the bottom surface (mounting surface) of the workpiece W and the top surface of the actuating air plate 5 becomes zero when the workpiece w is floated above the actuating air plate 5, the workpiece W is efficiently prealigned by the air blown to both side surfaces. In other words, the workpiece W can be finely prealigned even with a small amount of air from the pair of air-blowing units 3.

Note that the air chamber 6 may be configured to be connected with a vacuum pump through an air suction tube such that air is supplied and sucked in a switchable manner to vacuum-suck the workpiece W at the conveyance ending position Pe. Accordingly, the workpiece W can be sucked and fixed at the conveyance ending position Pe in a prealigned state. As a result, when the workpiece W is picked up at the conveyance ending position Pe, it can be picked up without causing the positional deviation thereof.

What is claimed is:

1. A workpiece conveyor comprising:
   a workpiece conveying path which guides the conveyance of a workpiece; and
   a pair of air-blowing devices which are disposed on both sides of the workpiece conveying path and blow air uniformly to the workpiece on the workpiece conveying path from both sides to give propulsion to the workpiece for conveyance;
   wherein the respective air-blowing devices further include a plurality of propulsion nozzles which blow air to the side surface of the workpiece from a direction oblique to the conveying direction and a plurality of control nozzles which blow air to the side surface of the workpiece from a direction orthogonal to the conveying direction to control the posture of the workpiece; and
   the plurality of propulsion nozzles and control nozzles are arranged side by side in the conveying direction in a mixed state.

2. The workpiece conveyor according to claim 1, wherein an interval between the plurality of propulsion nozzles of the respective air-blowing devices is shorter than one-half the length of the side surface of the workpiece.

3. The workpiece conveyor according to claim 1, wherein the pair of air-blowing devices have the respective propulsion nozzles and control nozzles arranged opposite to each other.

4. The workpiece conveyor according to claim 1, wherein an interval between the plurality of propulsion nozzles and the plurality of control nozzles of the respective air-blowing devices is shorter than one-half the length of the side surface of the workpiece.

5. The workpiece conveyor according to claim 1, wherein a width of the workpiece conveying path is formed narrower than that of the workpiece.

6. A workpiece conveyor comprising:
a workpiece conveying path which guides the conveyance of a workpiece; and
a pair of air-blowing devices which are disposed on both sides of the workpiece conveying path and blow air uniformly to the workpiece on the workpiece conveying path from both sides to give propulsion to the workpiece for conveyance;
wherein the workpiece conveying path is composed of a pair of divided conveying paths on which a workpiece is straddlingly mounted; and
includes a separation distance adjusting device which moves at least one of the pair of divided conveying paths to a direction orthogonal to the conveying direction for adjusting a separation distance between the pair of divided conveying paths.

7. The workpiece conveyor according to claim 6, wherein the pair of divided conveying paths extend parallel to each other in the conveying direction, and
the separation distance adjusting device adjusts the separation distance between the pair of divided conveying paths while keeping their parallel state.

8. The workpiece conveyor according to claim 6, wherein the pair of divided conveying paths extend non-parallel to each other and taperingly in a truncated chevron shape in the conveying direction, and
the separation distance adjusting device adjusts the separation distance between the pair of divided conveying paths while keeping their non-parallel state.

9. A workpiece conveyor comprising:
a workpiece conveying path which guides the conveyance of a workpiece;
a pair of air-blowing devices which are disposed on both sides of the workpiece conveying path and blow air uniformly to the workpiece on the workpiece conveying path from both sides to give propulsion to the workpiece for conveyance, the workpiece conveying path being composed of a plurality of actuating air plates successive in a conveying direction and formed of a perforated plate and an air chamber communicating with the perforated plate;
an air supplying device which supplies air to the air chamber to float the workpiece through the perforated plate;
a vacuum suction device which sucks air from the air chamber to suck the workpiece through the perforated plate; and
a switch controlling device which switches between the air supplying device and the vacuum suction device.

10. The workpiece conveyor according to claim 9, wherein the perforated plate is a porous plate.

11. A method of conveying a workpiece comprising:
blowing air uniformly to both side surfaces of a workpiece conveyed by a belt conveyor from both sides thereof with a pair of air blowing devices to convey the workpiece while controlling its posture in the plane surface;
wherein the respective air-blowing devices further include a plurality of propulsion nozzles which blow air to the side surface of the workpiece from a direction oblique to the conveying direction and a plurality of control nozzles which blow air to the side surface of the workpiece from a direction orthogonal to the conveying direction to control the posture of the workpiece, and
the plurality of propulsion nozzles and control nozzles are arranged side by side in the conveying direction in a mixed state.

12. A workpiece conveyor comprising:
a belt conveyor in which a workpiece is mounted on a belt and conveyed; and
a pair of air-blowing devices which are disposed on both sides of the belt conveyor and blow air to the workpiece conveyed by the belt from both sides;
wherein the pair of air-blowing devices blow air uniformly to both side surfaces of the workpiece to control the posture thereof in the plane surface of the belt;
the pair of air-blowing devices include a plurality of groups of blowing nozzles which are arranged at the same position orthogonal to the conveying direction to make a pair; and
the respective blowing nozzles blow air in a direction substantially orthogonal to the conveying direction.

13. The workpiece conveyor according to claim 12, wherein
an interval between the plurality of blowing nozzles of the respective air-blowing devices is shorter than one-half the length of the side surface of the workpiece.

14. The workpiece conveyor according to claim 12, wherein
the plurality of blowing nozzles of the respective air-blowing devices are disposed at uniform intervals from a position near a conveyance starting position to a conveyance ending position of the belt conveyor.

15. The workpiece conveyor according to claim 12, wherein
a width of the belt is formed narrower than that of the workpiece.

16. A workpiece conveyor comprising:
a belt conveyor in which a workpiece is mounted on a belt and conveyed; and
a pair of air-blowing devices which are disposed on both sides of the belt conveyor and blow air to the workpiece conveyed by the belt from both sides;
wherein the pair of air-blowing devices blow air uniformly to both side surfaces of the workpiece to control the posture thereof in the plane surface of the belt;
the pair of air-blowing devices include a plurality of groups of blowing nozzles which are arranged at the same position orthogonal to the conveying direction to make a pair; and
the plurality of blowing nozzles of the respective air-blowing devices are disposed from a position near a conveyance starting position to a conveyance ending position of the belt conveyor in such a manner that the blowing nozzles are densely disposed as they get closer to the conveyance ending position.

17. A workpiece conveyor comprising:
a belt conveyor in which a workpiece is mounted on a belt and conveyed; and
a pair of air-blowing devices which are disposed on both sides of the belt conveyor and blow air to the workpiece conveyed by the belt from both sides;
wherein the pair of air-blowing devices blow air uniformly to both side surfaces of the workpiece to control the posture thereof in the plane surface of the belt;
the pair of air-blowing devices include a plurality of groups of blowing nozzles which are arranged at the same position orthogonal to the conveying direction to make a pair;
the plurality of blowing nozzles of the respective air-blowing devices are disposed at uniform intervals from a position near a conveyance starting position to a conveyance ending position of the belt conveyor, and further comprising:

an air controlling device which individually controls an amount of air blown from the plurality of blowing nozzles, wherein the air controlling device controls an amount of air blown from the respective air nozzles such that the workpiece receives an increased amount of air as it approaches the conveyance ending position.

18. A workpiece conveyor comprising:

a belt conveyor in which a workpiece is mounted on a belt and conveyed; and a pair of air-blowing devices which are disposed on both sides of the belt conveyor and blow air to the workpiece conveyed by the belt from both sides;

wherein the pair of air-blowing devices blow air uniformly to both side surfaces of the workpiece to control the posture thereof in the plane surface of the belt;

the belt includes an actuating air plate formed of a perforated plate and an air chamber communicating with the perforated plate at least at a position on which the workpiece is mounted, and further comprises:

an air supplying device which supplies air to the air chamber to float the workpiece through the perforated plate.

19. The workpiece conveyor according to claim 18, further comprising:

a vacuum suction device which sucks air from the air chamber to suck the workpiece through the perforated plate; and a switch controlling device which switches between the air supplying device and the vacuum suction device.

20. The workpiece conveyor according to claim 18, wherein the perforated plate is a porous plate.

* * * * *